(12) United States Patent
Hunter

(10) Patent No.: US 6,756,751 B2
(45) Date of Patent: Jun. 29, 2004

(54) MULTIPLE DEGREE OF FREEDOM SUBSTRATE MANIPULATOR

(75) Inventor: Bradley L. Hunter, Lexington, MA (US)

(73) Assignee: Active Precision, Inc., Burlington, MA (US)

( * ) Notice: Subject to any disclaimer, the term of this patent is extended or adjusted under 35 U.S.C. 154(b) by 50 days.

(21) Appl. No.: 10/077,168

(22) Filed: Feb. 15, 2002

(65) Prior Publication Data

US 2003/0156270 A1 Aug. 21, 2003

(51) Int. Cl.⁷ .............................................. H02K 41/00
(52) U.S. Cl. ........................ 318/135; 310/12; 318/119
(58) Field of Search ................ 318/119, 127, 318/128, 129, 135, 12, 13, 14; 310/12, 13, 14; 335/53, 72

(56) References Cited

U.S. PATENT DOCUMENTS

| 5,360,445 A | * | 11/1994 | Goldowsky | ................ 623/3.22 |
| 6,196,514 B1 | * | 3/2001 | Kienholz | .................... 248/550 |
| 6,473,161 B1 | * | 10/2002 | Cuijpers et al. | .............. 355/53 |

* cited by examiner

Primary Examiner—Thanh Lam
Assistant Examiner—Judson H. Jones
(74) Attorney, Agent, or Firm—Choate, Hall & Stewart

(57) ABSTRACT

A system for manipulating a planar substrate such as a semiconductor wafer is provided. The manipulator is typically used in conjunction with an XY stage to focus and planarize a wafer with respect to a tool. The manipulator employs redundant actuators of different types and a control system that uses low-bandwidth, high efficiency actuators to provide low frequency forces and high-bandwidth, but less efficient, actuators to provide all other forces. The manipulator provides support and manipulation of a substrate while minimizing errors due to thermal distortion.

22 Claims, 23 Drawing Sheets

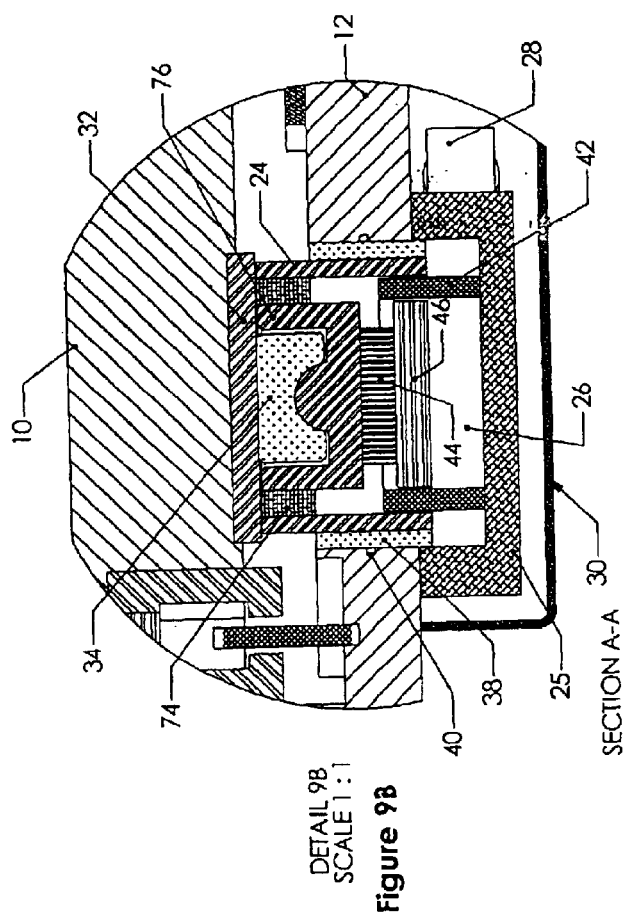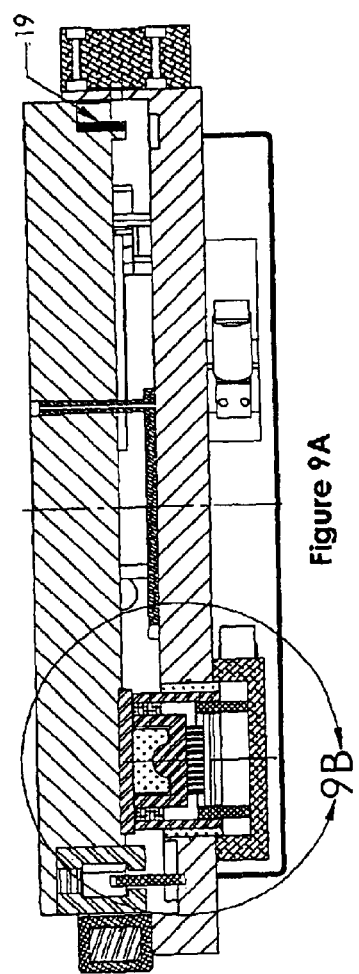

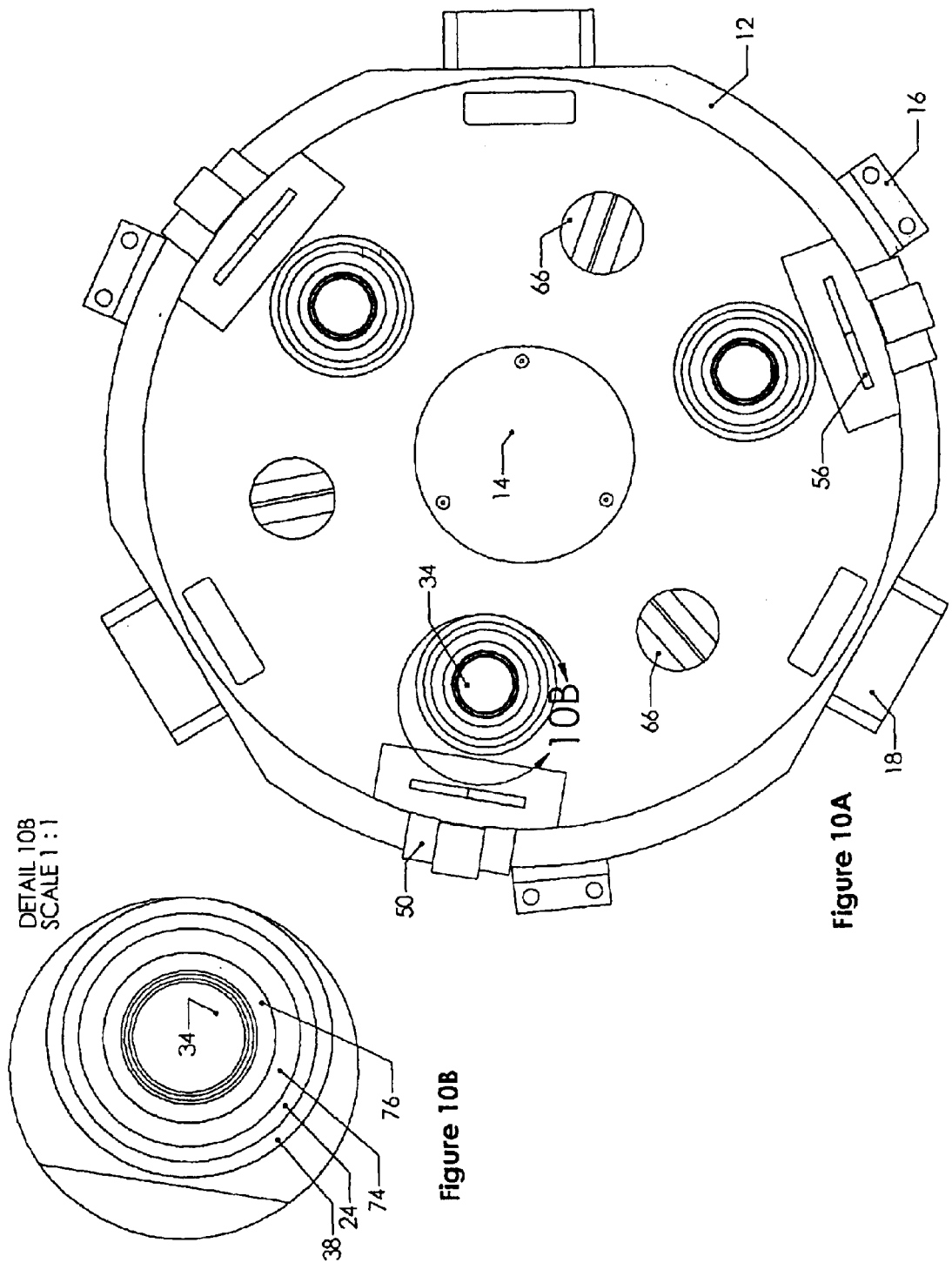

SECTION F-F
SCALE 1 : 4

DETAIL 17C

DETAIL 17D

SECTION E-E
SCALE 1 : 4

DETAIL 18C
SCALE 1:1

MULTIPLE DEGREE OF FREEDOM SUBSTRATE MANIPULATOR

BACKGROUND OF THE INVENTION

1. Technical Field

This application relates to handling substrates, and more particularly to handling of a substrate with control over an operating range spanning a minimum of three and a maximum of six degrees of freedom.

2. Description of Related Art

Substrate handling mechanisms are often used in equipment designed to process semiconductor wafers, flat screen liquid crystal displays, printed circuit boards, and micromachine assemblies. Similar mechanisms are used in failure analysis systems, electrical and functional testing systems, and IC packaging systems.

Modern semiconductor wafers may be cylindrical substrates of silicon, up to 300 mm in diameter, and may be less than 1 mm thick. During many of the manufacturing processes of semiconductor devices, wafers are held on a substrate holder known as a chuck, using vacuum. The chuck is often also used as a substrate handler, to position the substrate at a specified location in up to six dimensions, and to move the substrate from an input section of a processing or testing system, through the process steps, and finally to an output section for removal. A chuck may be machined from aluminum, silicon carbide or other material, having a top surface that is machined to be flat. There may be vacuum outlets in the flat surface of the chuck that may be in the form of connected grooves cut into the flat surface. The vacuum system holds the wafer, or other planar substrates such as liquid crystal display panels, to the flat chuck surface. A non flat substrate or wafer may be made flatter by the action of the vacuum hold down of the chuck. On the other hand, the strain placed upon the chuck by the flattening action of the vacuum may result in warpage of the chuck surface, and consequent loss of planarity of the wafer or substrate. One method for addressing the chuck warpage problem is to make the chuck thicker and more massive, and thus more resistant to the strain of the wafer. However, increasing the mass of the chuck results in increased force necessary to move the chuck, and consequently increases stage mass and motor power levels.

Many of the manufacturing steps used to create integrated circuits, and other small dimension devices on substrates, require that the wafer or substrate position and orientation be precisely controlled. This requirement may be meet using what is known as an X Y stage to manipulate the wafer over a planar region, and what is known as a Z-theta chuck system to raise and lower and rotate the wafer about an axis normal to the nominal XY plane. Certain processes also require active manipulation of the plane of the wafer in order to maintain the wafer surface parallel to the plane of the process tool. This may be necessary if the wafer front surface and the wafer back surface are not exactly parallel. This condition is known as taper. The thickness of the wafer may also vary from place to place, a situation known as bow. Thus, a chuck may be required to rotate the front surface of the wafer in what is known as roll, pitch and yaw. Each of these three motions can be considered to be rotations around the X, Y or Z axis respectively.

Processes that require these sorts of motions include step and repeat camera imaging systems, which need the front surface of the wafer to be flat over a large surface area. If a change in the front surface location with respect to the focal plane of the camera occurs during any of the rotations around the orthogonal axes, then the resulting image will not be in focus at all points.

As semiconductor technology has increased with improved semiconductor performance, the wafer diameters have increased over successive generations of semiconductor manufacturing equipment from less than 100 mm to the current standard of 300 mm. At the same time, the precision requirements of the semiconductor manufacturing equipment has become tighter as the critical line width sizes have become smaller with the increased technological level. The requirement to maintain tighter line widths that accompanies the increase in technological level, also results in increased alignment accuracy and precision requirements, and to a decreased depth of field capability. The depth of field problem requires that the wafer surface be flatter, which consequently requires that the wafer chuck be flatter and strong enough to hold the wafer flat. The increase in required precision thus includes the need for improved capabilities to move the wafer accurately in the horizontal plane, the XY plane, as well as in the vertical direction, i.e. Z. Increase in required precision also requires accurate motion of the wafer in the roll, pitch and yaw directions.

Traditional chuck systems rely on mechanical bearings and machining tolerances to maintain the plane of the wafer attached to the chuck parallel to the XY plane of the stage. Mechanical approaches to a wafer chuck become more difficult as the mass of the chuck increases and the precision requirements become more severe. This is because as the wafer chuck mass increases, the mechanical bearings used to constrain the chuck necessarily become larger. As the precision requirements increase, the mechanical bearings must resort to increased levels of what is known as a preload in order to achieve the necessary stiffness to maintain precision and avoid vibration. As each of the elements becomes more massive and the stiffness increases, the forces required to support the more massive chuck and overcome the friction of bearings and actuators also consequently increases. Typical electromechanical actuators, such as motors, dissipate power in proportion to the square of the force they produce. Thus, as the chuck mass increases and the bearing mass increases, the size of the actuator and the actuator power must also increase, resulting in increased power dissipation and local heating of the wafer. Heating of the wafer may be a problem because expansion of the wafer results in a shifting of the location of different parts of the wafer, and thus loss of precision and repeatability. The different coefficients of thermal expansion of the aluminum (or other material) chuck and the semiconductor wafer may also result in mismatched stress between the chuck and the wafer, and may result in wafer warpage. Thus, power dissipation in the actuators of the chuck may lead to thermal gradients and corresponding changes in the mechanical dimensions of the chuck mechanism, which may be another major impediment to achieving the levels of precision required in many semiconductor processes, liquid crystal display processes, thin film magnetic head processes, and micro-machining processes.

Some of the above described problems have been addressed in prior art chuck mechanisms by restricting the range of Z motion to less than 0.1 mm, and using a flexure suspended chuck driven in the Z direction by piezo actuators. While these devices provide large forces with negligible heat generation, they are unable to provide sufficient range of motion to allow wafer transfers between a transfer robot and the chuck. This is because during the loading and unloading of a wafer onto the chuck, a minimum gap of approximately 6 mm must be established between the bottom of the wafer and the top of the chuck. This spacing is necessary for the robot or operator to insert a vacuum paddle between the chuck and the wafer to move the wafer while only touching the wafer backside, and thus prevent damage to the front surface of the wafer. Contact with the front surface of the wafer may result in physical damage such as scratching, and may also result in contamination of the devices on the front surface. Thus, piezo actuators must have a separate mechanism to provide the chuck with enough separation to allow wafer transfers. This additional requirement of piezo actuators increases the cost, complexity, and the mass of the stage.

Another problem with mechanical methods of moving a wafer chuck around, such as the piezo actuators, is that the physical contact of the piezo actuators with the chuck may represent another source of stress and strain, and therefore cause deformation of the chuck and resulting loss of precision. As noted before, certain manufacturing processes, such as semiconductor device manufacture, liquid crystal display manufacture, and thin film magnetic head manufacture, require extreme flatness in the manufactured device, and consequently extreme flatness in the chuck.

Since the chuck mechanism is often carried on an XY stage, the chuck design can have a major influence on the XY stage design and performance. The XY stage performance is affected by the mass and height of the chuck. As the chuck mass increases, the stage must be made larger and must be able to dissipate more power and heat in order to achieve a sufficient level of performance and precision. Since the power dissipation increases with the square of the total stage mass, a small increase in mass may result in a large increase in power consumption. The heat dissipated by the stage influences the stage accuracy and precision due to thermal disturbance of the air inside a tool, since the thermal gradients disrupt the precision of the distance measuring laser interferometers that are typically used to measure the location of the stage. Changes in heat dissipation also affect the precision of the interferometer, and thus the repeatability of the operation. As an example, the operation of a step and repeat camera requires the movement of the wafer chuck from image field to image field be as precise as possible in order to minimize the amount of time spent on each image field in fine alignment.

Many semiconductor process tools involve optical lens elements that must be in close proximity to the top of the wafer surface. The clearance between the top of the wafer surface and the process tools, for example in a step and repeat camera, or a direct write laser beam lithography tool, may be less than 1 mm. In the specific case of wafer probing, actual mechanical contact is made between the wafer and probe pins. Thus, in order to achieve the necessary clearance for wafer transfers, i.e. >6 mm, the wafer must be raised or the chuck must be lowered. Since the separation of wafer and processing tool maybe less than 1 mm, in many such cases the wafer cannot be raised, and thus the chuck must be lowered. However it has been previously noted that it is difficult to have high precision and large motion simultaneously. Thus prior art chuck systems have the XY stage carrying the chuck move away from underneath the tool before wafer transfers occur. This causes increased time, cost, size and heat dissipation of the stage.

The trend in the various fabrication industries, such as semiconductor, liquid crystal display, thin film magnetic head, and micro-machining, toward larger substrate sizes and increased precision in chuck location, results in the need for a chuck that can provide precision control in X, Y, Z, roll, pitch, and yaw. The chuck must also provide a large motion in the Z direction, minimize the mass and power needed to move the chuck on the XY stage, maintain a constant temperature at the chuck and wafer, and not apply stress to the wafer. The chuck must also be able to compensate for externally applied forces on the wafer, such as found in wafer probers.

SUMMARY OF THE INVENTION

According to the present invention, an apparatus for manipulation of a planar substrate includes a housing movable on an X-Y stage that transports the housing in at least two orthogonal directions, a surface handler disposed within the housing and having a substantially flat surface, a plurality of position sensors disposed about at least one of a periphery of the surface handler and a periphery of the housing, at least one air-bearing sleeve disposed in the housing, at least one piston disposed within the at least one sleeve and having at least one pressure chamber formed by the piston and air-bearing sleeve, at least one valve that may be used to modulate the flow of fluid from the pressure chamber to an exhaust pressure, at least one voice coil motor disposed within the piston, at least one air-bearing pad disposed at one end of the piston opposite the pressure chamber and acting against a surface of the surface handler opposite the flat surface where the pressure from the air-bearing pad against the surface handler is opposed by a magnetic attraction between the surface handler and the piston, a plurality of magnetic regions located at preselected portions of the surface handler, a plurality of radial actuators disposed on the housing and corresponding to at least a portion of the plurality of magnetic regions of the surface handler, and a plurality of tangential actuators that correspond to at least a portion of the magnetic regions of the surface handler.

The housing may move the surface handler in at least an X direction, a Y direction, a Z direction, a yaw direction, a roll direction and a pitch direction. The housing may include at least one actuator for each direction of motion. The planar surface handler may be completely supported and transported by the actuators. The surface handler may be a chuck. The chuck may be a vacuum chuck. The chuck may be an anodized aluminum alloy circular cylinder. The chuck may have a central region having an array of grooves embedded in the flat surface and connected to a vacuum control line. The central region may be a circle having a radius of approximately 200 mm, and the array of grooves may be a plurality of concentric circular grooves having a common center at approximately a center of the chuck. The chuck may further include a peripheral region having a second array of grooves embedded in the flat surface and connected to a second vacuum control line. The second array of grooves may be an annular region of approximately 200 to 300 mm radius. The substantially flat surface of the surface handler may include a plurality of vacuum conduits. The plurality of vacuum conduits may include at least two different vacuum control areas, each area having a separately controllable vacuum pressure source. The plurality of vacuum conduits may be arranged in rings. The surface handler may not directly contact the housing. The plurality of position sensors may be three. The plurality of position sensors may provide position measurements in two dimensions. The surface handler may include a plurality of holes through which pins, fixedly attached to the housing, are inserted perpendicular to the flat surface of the surface handler, and, in response to a signal that lowers the surface handler with respect to the housing, the pins may extend above the flat surface by at least a predetermined distance, which may be greater than approximately 6 mm. The plurality of holes may be three. The plurality of pins may be hollow. The hollow pins may be connected to a vacuum line. The surface handler may have an approximately circular top surface. The magnet of the voice coil motor disposed within the piston may provide the source of magnetic flux that preloads the surface handler against an air bearing pad. The magnet may attract the ferromagnetic region of the surface handler against the air bearing with a force sufficient to establish a desired stiffness and corresponding flying-height between the surface handler and the air-bearing pad disposed on top of the piston. The piston may include an air-bearing pad disposed above the surface of the piston and allowed to pivot with respect to a vertical axis of the piston. The pivot may be a ball pivot. The fluid in the sleeve may be air. The apparatus may also include a controller that modulates the valve to regulate the pressure in the pressure chamber and modulates the force in the voice coil motor in order to adjust the height of the surface handler with respect to the housing. The piston may have no sealing surface with respect to the sleeve to prevent the compressed air from leaking out at a controlled rate. The controlled rate may be determined by relative diameters of the piston and the sleeve. The apparatus may also include a single valve connected to each pressure chamber and normally operated in a partially open state to regulate the flow of fluid from the pressure chamber to an external source of pressure that is maintained at a pressure substantially below the nominal chamber pressure. The valve may be opened or closed in proportion to a signal from the controller in order to regulate the net mass flow of fluid between the fluid entering the chamber from the air-bearing sleeve and the mass flow of fluid leaving the chamber through the valve. The plurality of pistons may be three. The pistons may be driven differentially to generate motion around the X and Y axes. The controller may operate the valve and corresponding voice coil motor so as to minimize the power dissipated in each voice coil motor. The plurality of magnetic regions of the surface handler may be three. The plurality of tangential actuators may be three. The coils of the tangential actuators may be disposed in a portion of the housing and the low-reluctance components of the actuators may be fixed in the surface handler. The surface handler may have a plurality of ferromagnetic surfaces disposed around a peripheral portion of the surface handler that interact with a plurality of radially-acting electromagnetic actuators disposed in the housing. The plurality of actuators may be three. The surface handler may further include a plurality of projections disposed in a symmetric pattern on the surface opposite the flat surface and wherein the housing includes a plurality of depressions disposed in a corresponding pattern. The plurality of projections may equal three. The plurality of projections may further include balls and the plurality of depressions include vee-grooves. The apparatus may further include a control system that controls the plurality of radial actuators in a differential mode where the total amount of power provided to all of the radial actuators is maintained at a substantially constant value while generating net forces between the housing and surface handler in the X and Y plane. The housing may further include a recessed bottom portion disposed to fit into a recess in a corresponding X-Y stage.

According further to the present invention, an apparatus for manipulation of a substrate includes a handler having a flat surface that holds a substrate, a housing that holds the handler, a plurality of tangential actuators that cause rotation of the handler about an axis perpendicular to the surface of the handler, and a plurality of radial actuators, each actuator moving the handler with respect to the housing in a selected radial direction independent of rotation caused by the tangential actuators, wherein an increase in the force level of one of the plurality of radial actuators is counterbalanced by a reduction in the force level of at least one other of the radial actuators so that the power consumed by all of the radial actuators together is substantially constant.

According further to the present invention, an apparatus for manipulation of a substrate includes a handler that holds a substrate, a housing having a bottom surface that holds the handler, and a plurality of vertical actuators disposed in the housing to move the handler toward and away from the bottom surface of the housing, wherein an increase in distance from the bottom surface to the handler provided by one of the vertical actuators is counterbalanced by a decrease in distance from the handler to the bottom surface by another one of the vertical actuators to provide a rotation about an axis of rotation perpendicular to a direction of motion provided by the vertical actuators, wherein the axis of rotation is disposed at a location corresponding to a location in a substrate provided on the handler. The vertical actuators may include a magnet that attracts a magnetic plate disposed on the bottom surface of the handler and an air bearing that pushes against the plate. The handler may rotate in a plane that is substantially perpendicular to the direction of motion provided by the vertical actuators.

According further to the present invention, an apparatus for manipulation of a substrate includes a handler that holds the substrate, a housing that holds the handler, a plurality of patterned surfaces disposed on one of: the housing and the handler, wherein the patterned surfaces include one of the following combinations: at least six linear arrays, at least four linear arrays and at least one grid array, at least two linear arrays and at least two grid arrays, or at least three grid arrays, and a plurality of readers that read the combination to determine a location of the substrate in six degrees of freedom. The readers may be optical encoders.

According further to the present invention, an apparatus for manipulation of a substrate includes a handler that holds the substrate, a housing that holds the handler, and a plurality of actuators that move the handler in response to at least one control signal, where the plurality of actuators further includes at least one high frequency actuator and at least one low frequency actuator that provide motion in a single direction and wherein the at least one control signal includes a high frequency portion that is provided to the at least one high frequency actuator and a low frequency portion that is provided to the at least one low frequency actuator. The at least one low frequency actuator may reduce static forces on the at least one high frequency actuator. The at least one low frequency actuators may include at least one radial electromagnet. The at least one high frequency actuator may include at least one tangential electromagnet. The at least one low frequency actuator may be a pneumatic actuator. The pneumatic actuator may actuate the handler in a vertical direction. The at least one high frequency actuator may include an electromagnetic actuator that provides a force in a vertical direction on the handler.

According further to the present invention, an apparatus for manipulation of a substrate includes a handler that holds the substrate, a housing that holds the handler, and a plurality of vertical actuators disposed in the housing to move the handler toward and away from the bottom surface of the housing, wherein the vertical actuators are driven differentially to counteract and compensate for any vertical off axis forces applied to the substrate. The vertical actuators may include a magnet that attracts a magnetic plate disposed on a bottom surface of the handler and an air bearing that pushes against the plate. The apparatus may further include a ball disposed in each vertical actuator and a corresponding vee-groove disposed in the handler to allow roll and pitch motion of the handler. Compensation for vertical off axis forces may be provided primarily by a pneumatic actuator.

According further to the present invention, an actuator includes a piston movably guided by a fluid-bearing, a fluid chamber formed at one end of the piston having a chamber pressure controlled by balancing a fluid flowing into the fluid chamber with fluid exiting the chamber through a controllable orifice, and a voice coil motor disposed to move the piston located within the confines of the piston. The actuator may also include a control system that supplies large low-frequency forces by modulating the chamber pressure, and supplies low amplitude high-frequency forces via the voice coil motor.

According further to the present invention, an actuator that manipulates an object includes at least three tangentially acting voice coil motors disposed to move the object relative to the housing in a yaw direction, at least three radially acting electromagnet actuators maintaining a substantially constant gap between the object and a housing independent of motion in the yaw direction, and a control system that supplies the object with large low-frequency forces in a plane of the object using the radially acting electromagnet actuators, and supplies low amplitude high-frequency forces in the plane of the object and provides forces for motion in the yaw direction using the tangential voice coil motors.

According further to the present invention, a substrate manipulator providing six degrees of controllable motion for an object includes a housing, a substrate handler that holds the object and does not contact the housing, at least three actuators that move the object in Z, Roll and Pitch directions, and at least three actuators that move the object in X, Y and Yaw directions.

According further to the present invention, a substrate manipulator providing control of movements of an object in the Z, roll and pitch directions includes a housing, a substrate handler that holds the object disposed in the housing, and at least three actuators that move the object in a Z direction.

According further to the present invention, a substrate manipulator providing control of movements in the Z, roll, pitch and yaw directions, includes a housing, a surface handler disposed in the housing, at least one hub, disposed concentric to a center point of the housing and free to rotate about the Z axis using at least three magnetically preloaded air bearing regions located between the housing and the hub, a pair of magnetically preloaded bearings that constrain the hub to rotate substantially about the axis of the housing, at least three tangential voice coil motors that provide a yaw moment without creating any substantial XY force on the hub relative to the housing, and at least three Z actuators to move the surface handler with respect to the hub.

The size and configuration of the pneumatic actuator may be selected to enhance actuator performance in precision applications. The diameter of the air bearing sleeve affects the vertical actuator performance in three aspects.

The stiffness of the air bearing to piston assembly is influenced by the operating pressure and circumference of the air-bearing sleeve. A larger sleeve will yield greater stiffness for the same fluid pressure supplied to the air bearing. Greater stiffness is preferred in order to enhance precision of the manipulator.

A larger diameter air bearing sleeve implies a larger effective area of the pneumatic piston. For substantially similar net vertical force a larger piston area will require lower pressures in the pressure chamber. Generally one avoids low pressures in a pressure control situation due to the somewhat larger valve opening that is required to achieve a desired mass flow rate. In the present invention, the low chamber pressure is an advantage in that it effectively isolates the chamber pressure from the air-bearing performance. For an example cylinder diameter of approximately 50 mm, a typical working pressure in the pressure chamber is between 0 and 0.05 bar (that is between 0 and 5% of 1 atmosphere) above atmospheric pressure. Such low operating pressures ensure that the air bearing is unaffected by the minute changes in chamber pressure experienced during normal operations. The degree of effective isolation between the chamber and the air bearing ensures that the mass flow of fluid into the chamber is nearly constant in normal operation.

The low chamber pressure and therefore constant mass flow of fluid into the chamber from the air bearing provide an extremely "quiet" source of chamber pressure. A well known problem with fluid control systems is the level of noise that is often injected in to the pressure chamber due to turbulence in the servo valve. This is particularly true when a servo valve is used to control the rate of fluid entering the chamber. As the fluid passes across the control orifice in the valve, the fluid may enter the turbulent regime (Reynolds number above 2000). The turbulence in the fluid creates minute pressure disturbances that may be apparent as a source of noise making nanometer-level of precision difficult to achieve. The present invention avoids the use of an "orifice" sourcing fluid into the chamber. The air gap between the piston and air bearing sleeve are sufficient to ensure that the fluid entering the pressure chamber exhibits laminar flow. This avoids the "noise" of turbulent flow. The servo valve placed on the exhaust with an exhaust pressure to a pressure "source" held substantially below the pressure in the chamber (ie: a source of vacuum) ensures that the exhaust valve will be operated in the turbulent regime. Since the turbulence is on the exhaust side of the pressure chamber, the "noise" associated with the turbulent flow in the exhaust valve does not influence the pressure chamber. Furthermore, it will be readily apparent to those skilled in the art of compressible fluid flow, that operating the exhaust valve in the turbulent regime (above Reynolds number of 2000) ensures that no pressure variations in the exhaust pressure (ie: variation in the vacuum pressure) will propagate across the servo valve and influence either the chamber pressure or the mass flow through the servo valve. This allows a less expensive vacuum pump to be used.

BRIEF DESCRIPTION OF DRAWINGS

FIGS. 9A and 9B show a cross section of the housing and chuck according to the system described herein;

FIGS. 10A and 10B show a top view of the housing with the chuck removed according to the system described herein;

DETAILED DESCRIPTION OF EMBODIMENTS

Figure 1:
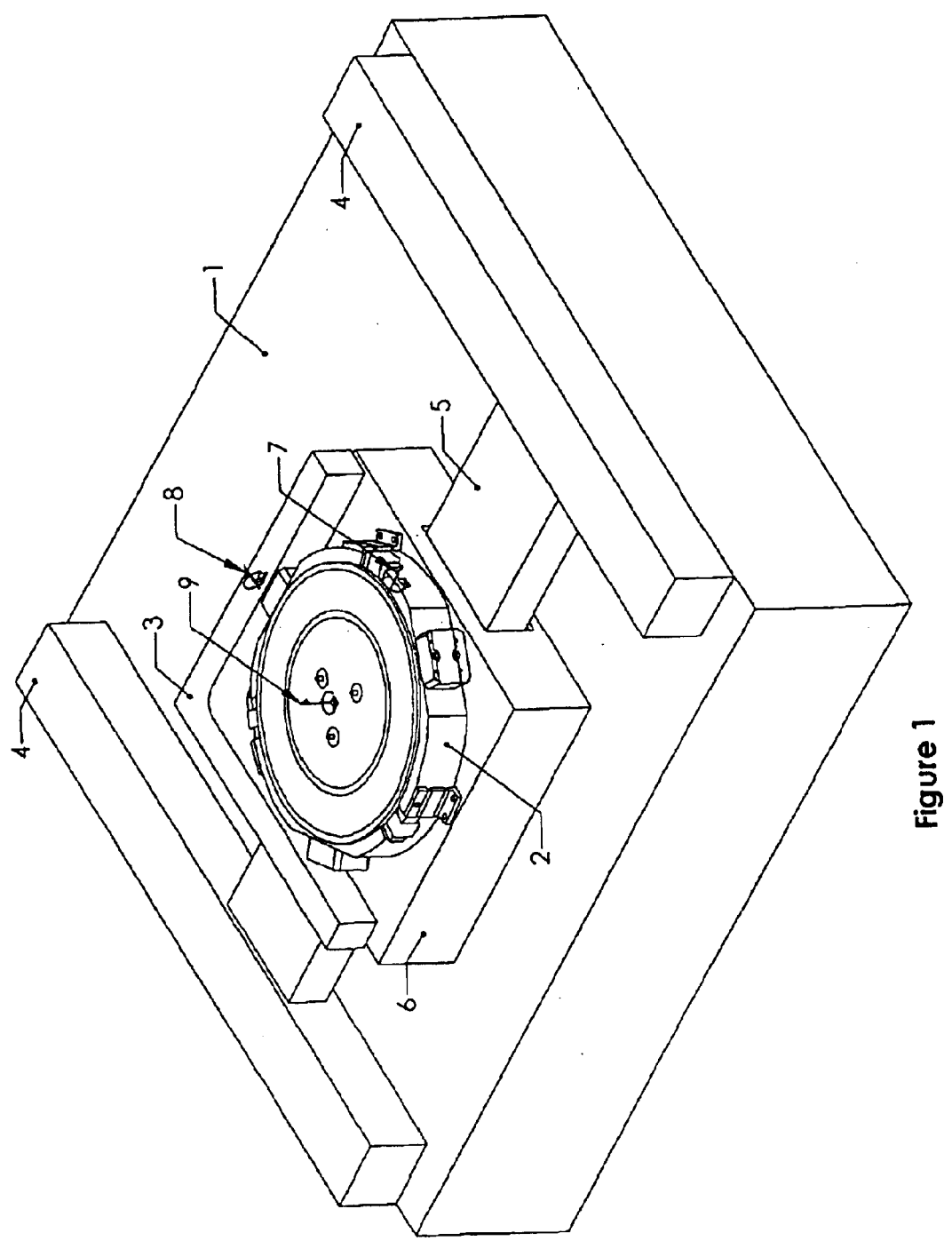
FIG. 1 shows an isometric view of a housing and a chuck according to the system described herein incorporated on an XY stage.

With reference to FIG. 1, shown is an isometric view of an XY stage 1 with the chuck and housing mechanism 2 mounted on the stage. The basic elements of the XY stage would be easily recognized by those skilled in the art as the dual Y-axis drives 4, a single X axis drive 5 which together drive the slider 6 and whose position is typically monitored by an interferometer (not shown) that monitors slider position via L-shaped interferometer mirror 3. The stage is not part of the present invention. It is shown merely for illustrative purposes.

Figure 2:
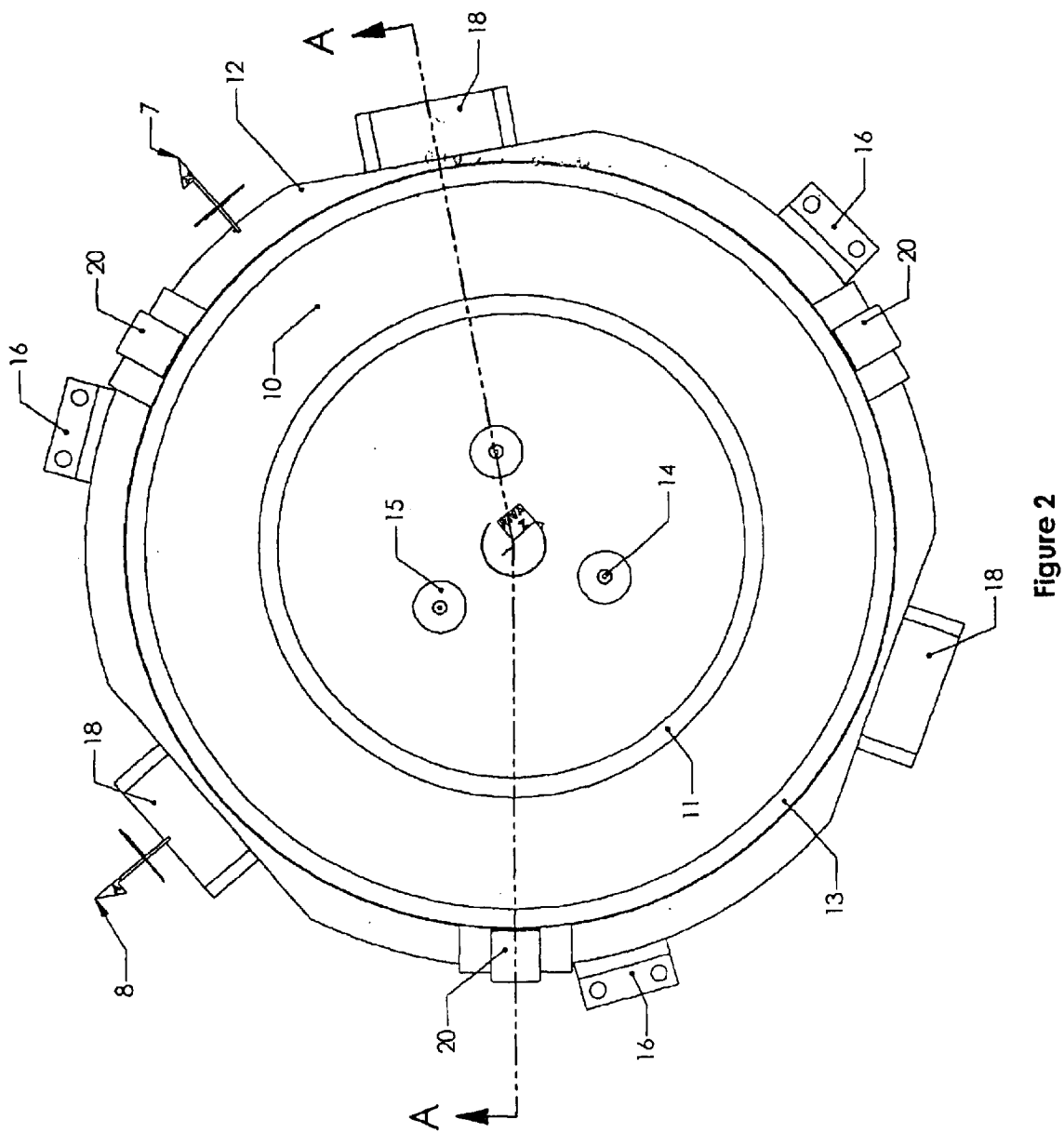
FIG. 2 shows a top view of the housing and the chuck along with a configuration for vacuum attachment according to the system described herein.

With reference to FIG. 2, shown is a top view of the substrate holder 10, supported by a housing 12 which substantially surrounds the sides and bottom of the substrate holder 10, and carries the substrate holder 10 in a plane on an XY stage 1. The substrate holder 10 has three wafer or substrate lift pins 14, each of which has a central hollow for connection to a vacuum pressure line for securing the wafer or substrate to the pins when the surface handler is lowered for substrate exchanges. The substrate holder 10, also known as a chuck, is suspended without contact to the housing 12. The housing 12, is connected to the XY stage for large-scale motion in the X and Y directions, by means of three flexure mounts 16 in this example embodiment. Each position sensor detector 18 may provide a separate horizontal and vertical position measurement for a six measurement system. Alternative embodiments may incorporate different type and number of position sensors and may monitor a minimum of 3 and maximum of 6 degrees of freedom of motion of the substrate holder relative to the housing. A Cartesian coordinate system incorporating an X axis 7, Y axis 8 and Z axis 9 with corresponding rotations of roll, pitch and yaw around the 3 axes respectively is indicated in FIG. 1.

Figure 3:
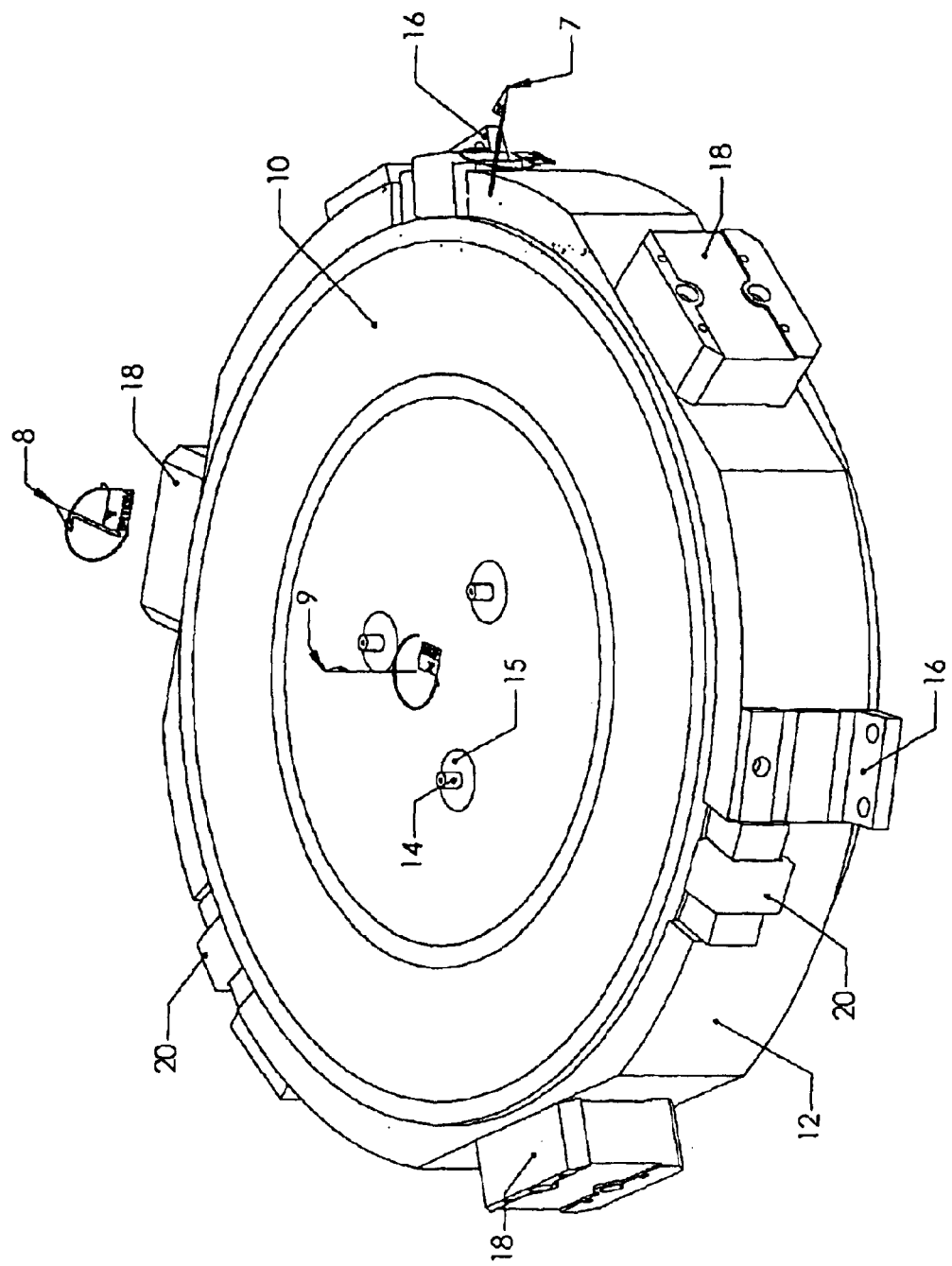
FIG. 3 shows an isometric of the housing and the chuck according to the system described herein.

With reference to FIGS. 2 and 3, the substrate holder or chuck 10 is shown with the three lift pins 14, which may be selectively connected to a vacuum source to hold the wafer or other planar substrate during wafer exchanges, for example during wafer loading and unloading operations. Additional vacuum attachment methods are used to hold the wafer or other planar substrate onto the holder 10 when the holder 10 is raised (normal operation). Shown is a two section vacuum system having roughly circular rings of vacuum. The shown two section vacuum system arrangement may be used for chuck systems that have variable diameter substrates to hold down to the chuck, or for situations where different vacuum pressures on the outer edge of the substrate may be required, such as for holding slightly warped wafers. FIG. 2 shows an inner vacuum region and an outer vacuum annulus. A land 11 provides a seal against the substrate bottom surface that separates the inner vacuum region from the outer vacuum annulus. A second land 13 provides a seal against the substrate bottom surface to isolate the outer vacuum annulus at the edge of the substrate. The vacuum regions may be patterned with miniature grooves, pyramids, serpentine grooves or other vacuum channel shapes known to those skilled in the art. Note that, in some embodiments, the connections between the various ones of the sets of vacuum rings may not be visible on the surface of the chuck as is shown in FIG. 2.

The chuck 10 may move in the X and Y axis directions for small distances within the housing 12. Such radial movements may be used, for example, in the fine alignment of an optical field in a step and repeat exposure system, after the XY stage has brought the proper portion of the substrate or wafer to the approximate position. Such movement allows rotation to be performed around a focal plane.

The radial motion of the chuck 10, within the housing 12 is controlled by three radial electromagnet coils 20 in this illustrative embodiment, which are embedded in the housing 12, and act on three ferromagnetic surfaces embedded in the chuck 10. The only power that needs to be generated in this radial motion is the electrical current used in the electromagnet coils 20, which are in the housing 12, and not connected directly to the chuck 10, and thus the heat generated during the XY motion does not impact the chuck as much as if the electromagnetic coils were located in the chuck. As discussed above, an increase in temperature will result in the chuck 10 expanding, and thus shift the wafer position.

Even though the heat producing portion of the radial motion actuators is separate from the chuck, there still may be some thermal contact that adversely effects the temperature of the chuck and the attached wafer, especially during periods when the amount of heat generated increases, such as at the beginning of an exposure sequence in a step and repeat camera imaging system. To address such a source of unwanted heat, the three radial electromagnet coils 20 move the chuck by means of differential magnetic fields, wherein if one electromagnetic coil needs to increase the magnetic field to draw the chuck closer, a combination of the other two electromagnetic coils reduce their field strengths to compensate for the increased power consumption, resulting in overall constant power consumption for the radial motion of the chuck. Thus the power consumption, and consequent heating, is designed to be held constant irrespective of the amount of motion, and the power/heat generators are not in direct contact with the chuck or substrate. It is clear that many different types of motion actuators may be used. In general, electromagnet (i.e., EM) actuators have a power consumption that varies proportionally to the force, and voice coil motors (i.e., VCM) are proportional to the square of the force.

The chuck 10 may also have sufficient motion in the Z direction (i.e., the vertical direction downward) to cause the chuck 10 to retract below the lift pins 14, thus effectively holding the wafer above the chuck surface for placement or removal by a transfer robot arm. Alternatively, the lift pins 14 may be flush against the surface of the chuck 10 or slightly recessed beneath the surface when the chuck 10 is raised for normal tool operations. The chuck 10 vertical motion is provided by a combination of three pistons and three Z electromagnetic devices in this illustrative embodiment, for example voice coil motors (i.e., VCM) which are discussed in more detail in connection with subsequent figures. The vertical or Z motion needs to be sufficient for substrate handling on and off the chuck, and preferably is more than 6 mm, and even more preferably is 11 mm.

FIG. 3 is an isometric view of the chuck 10, housing 12, and lift pins 14. The isometric view provides a better view of the orientation of certain features of the substrate handling system, especially when used in conjunction with the schematic view of FIG. 2. FIG. 2 shows the chuck 10 in the down position, where it is as deeply embedded as possible in the housing 12, and thus the fixed lift pins 14 are at a full extension position above the surface of the chuck 10. The lift pins 14 may slide vertically within close fitting bores in the chuck 10. Alternatively, the pins may be fixed to the housing and extend through holes in the chuck 10 with sufficient clearance to accommodate the range of motion of the chuck 10 with respect to the housing 12. Sealing lands 15 may be provided around each lift pin hole in order to isolate the lift pin from the inner vacuum region of the chuck 10. FIG. 3 also shows an orientation of the flexure mounts 16 to the XY stage, and the position sensor detectors 18.

Figure 4:
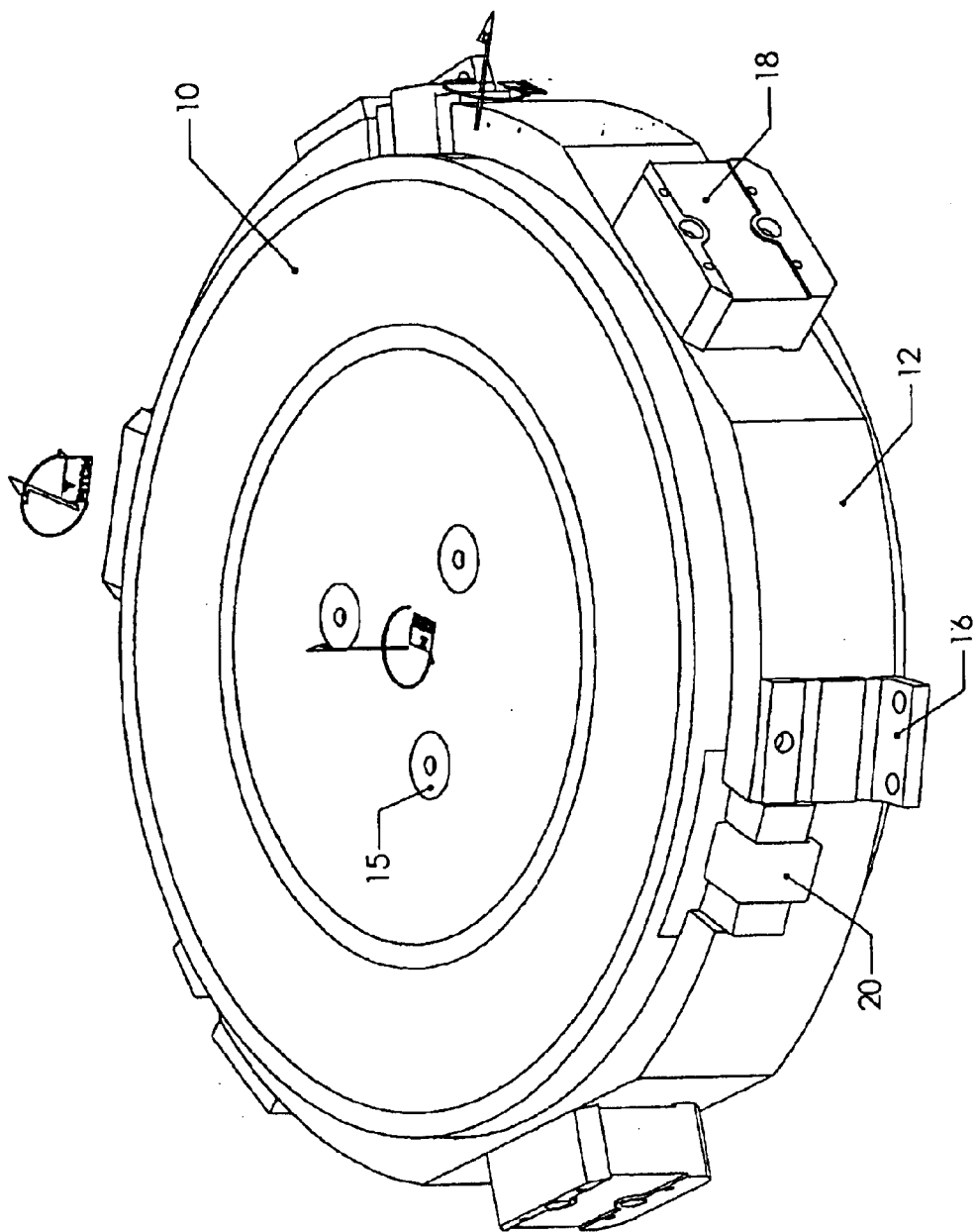
FIG. 4 shows a different isometric of the housing and the chuck according to the system described herein.

FIG. 4 shows an isometric view of the chuck, similar to FIG. 3, but with the chuck 10 being in an up position, and consequently the pins 14 being in a non-extended position. Also shown is one of the radial electromagnets (i.e., EM) 20, which is shown in FIG. 2 and described above.

Figure 5C:
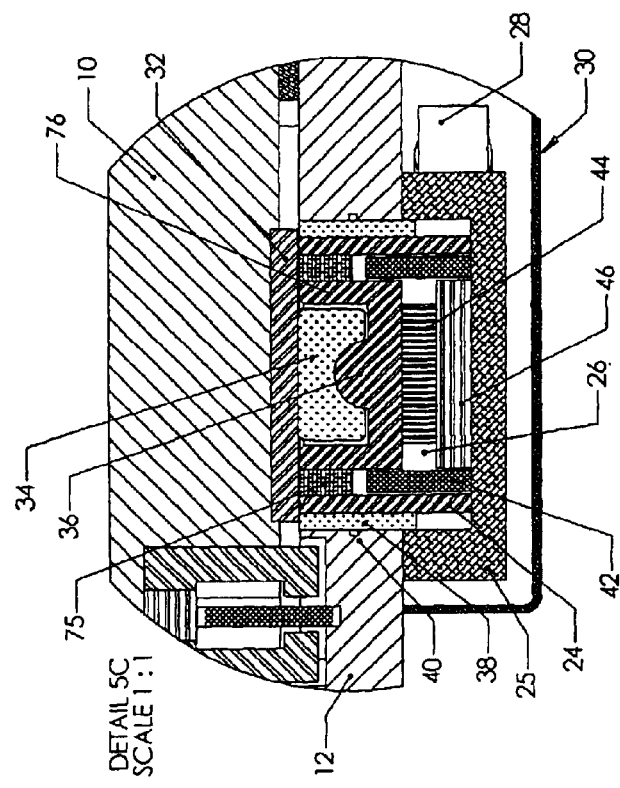
FIGS. 5A, 5B, and 5C show a cross section view of the housing and the chuck according to the system described herein.
Figure 5B:
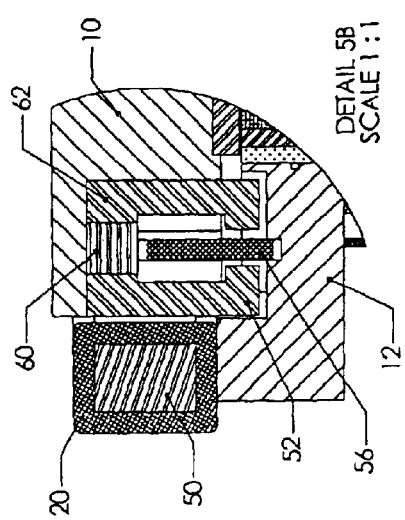
Figure 5A:
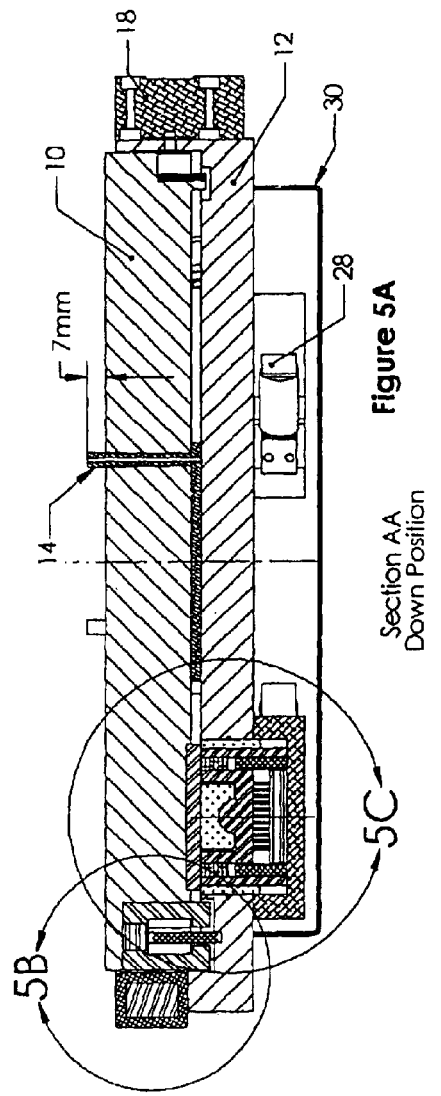

FIG. 5A is a cross section view along the line A—A of FIG. 2. FIGS. 5B and 5C show details from FIG. 5A. FIG. 5A shows the chuck 10 being in the lowest position relative to the housing 12, with the lift pins 14 thus extending above the surface of the chuck 10 as far as possible, 7 mm in this embodiment. FIGS. 5A, 5B, and 5C show one of the Z direction actuators, which in this illustrative embodiment consist of three distributed actuators, shown in FIG. 6 and described below. The Z actuator in this illustrative embodiment includes a controllable air bearing-guided pneumatic actuator and a VCM. The pneumatic actuator has a piston 24, which may be made of steel, other magnetic materials or non magnetic materials. A piston cap 25, seals one end of the air bearing sleeve and thereby forms a pressure chamber 26. If the piston is made of a non magnetic material, it may be necessary to provide a separate magnetic return path. The preferred embodiment uses clean dry air as the pneumatic fluid for air bearings as well as the controllable pneumatic actuator, but other fluid mediums can easily be used. There is a pneumatic valve 28 which is operated to control the pressure in the pressure chamber. In a preferred embodiment, the air bearing sleeve 38 provides a continuous source of fluid entering the chamber. The valve 28 is connected to a remote source of vacuum (not shown) and modulated to obtain the desired chamber pressure. Normally, valve 28 will be partially open and exhausting to vacuum an amount of fluid that just balances the fluid entering the chamber from the air bearing sleeve. The preferred distance of Z motion of the pistons 24 is at least 6 mm, and more preferably at least 11 mm. The top surface of the piston 24 pushes against a steel pad 32 on the underside of the chuck 10, but is separated from direct contact with the chuck 10 or with the steel pad 32 by a passive air bearing pad 34, made of a porous material, and located in a cavity on the top surface of the steel piston 24. The air bearing pad 34 can move in the roll and pitch directions to maintain a substantially parallel face to the chuck 10 or steel pad 32 because of a ball pivot mount 36. The steel pad 32 may be a magnetically preloaded ferrous pad region.

The piston 24 is freely movable in the Z direction without substantial friction from motion against the housing 12, due to a porous passive air bearing 38 having an annular air supply 40. In one embodiment of the invention, the Z air bearing does not have any sealing surfaces in order to eliminate any friction between the Z actuator and the housing 12.

The pneumatic actuator portion of the Z actuators described above provides the static and slowly varying (i.e. low frequency) component of the vertical forces necessary for vertical movement for the chuck 10. The only power dissipated within the pneumatic actuator is in the valve 28. The valve dissipation is nearly constant regardless of the load that is being supported. However, the pneumatic actuator is only operable over low frequencies. There is a need for high bandwidth motion that an air actuator may not provide. Thus the Z actuators include at least one voice coil motor (i.e., a VCM) 42 for each piston 24, located between the piston 24 and a permanent magnet 44, which is located below the air bearing pad 34. The magnet may be magnetized in the vertical direction in a preferred embodiment. The magnet 44 may have a pole piece 46 direct the magnetic flux of the magnet radially across the air gap and into the outer ferromagnetic piston cylinder. The coil 42 of the VCM is preferably located on the piston cap 25 of the housing 12, and thus the heat-generating portion of the overall VCM is not directly attached to the chuck. The moving magnet configuration depicted in the figures eliminates the necessity for the VCM coil wires to flex, thereby improving reliability of the apparatus. It should be noted that a combination of different Z axis motions by each of the Z actuators 22, shown in FIGS. 5A, 5B, and 5C, will result in motion of the wafer top surface in Z, roll and pitch directions. The Z actuators use the flux of the permanent magnets 44 to attract the ferromagnetic steel pads 32, while the air bearing 34 maintains a relatively constant separation from the chuck. The variable controlled pressure in the chamber 26 provides Z motion for low frequency forces, while high frequency forces are provided by the VCMs 42. There is constant and relatively low heat dissipation due to the use of pressure in chamber 26 to take up static and slowly varying loads.

FIG. 5B further shows details of the radial electromagnet actuators discussed in connection with FIG. 2. One of the radial coils 20 is shown, wrapped around a pole piece 50, and controllably acting to attract the outer pole piece 52, in conjunction with the other two radial electromagnet actuators 20 shown in FIG. 2. FIG. 5B also shows details of an embodiment of one of the tangential VCM actuators. The tangential actuators consist of a coil 56, which may have a double loop configuration, as is better seen in FIG. 6 (discussed below). The coil 56, shown in cross section, operates to rotate the chuck 10 around the Z axis, known as yaw, using a permanent magnet 60 and pole piece 52 and 62. The combination of three (or more) tangential actuators also provide small amplitude, high frequency XY forces that are not handled by the limited bandwidth capability of the radial electromagnets.

Figure 7A:
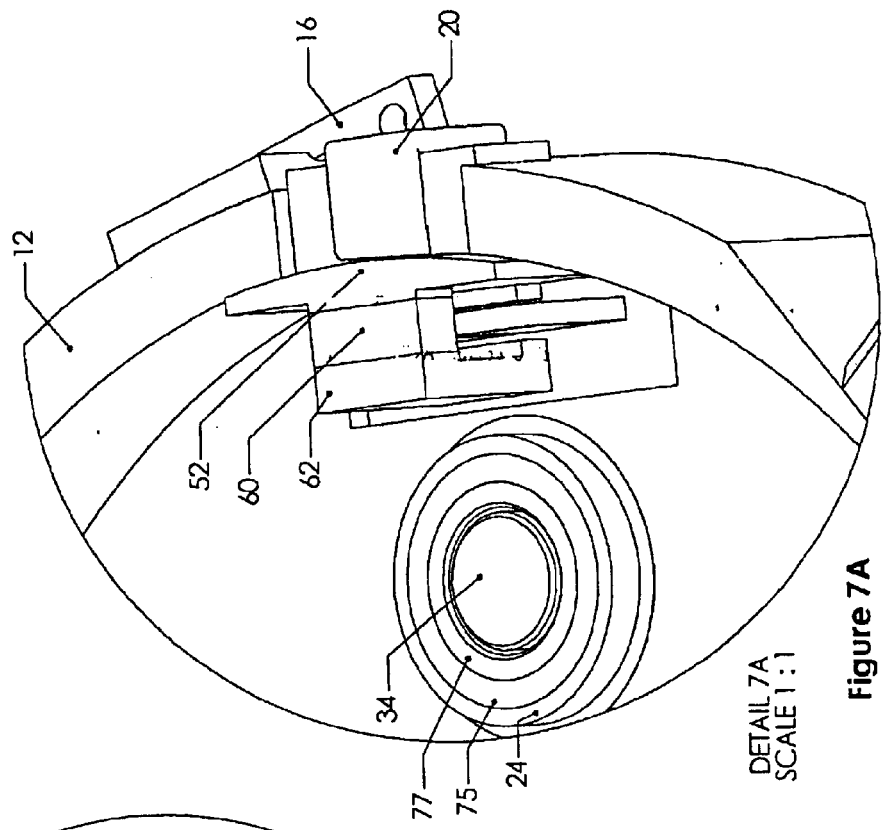
FIGS. 7A and 7B show a different isometric view of part of the housing and the chuck according to the system described herein.
Figure 7B:
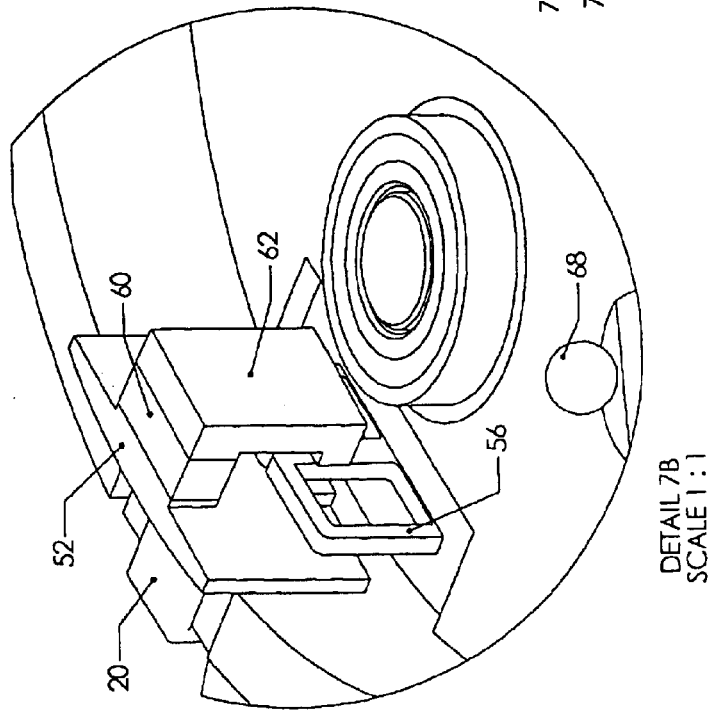

FIGS. 7A and 7B show an isometric view of the Z actuator 24 in an extended position, and shows greater detail of the arrangement of the tangential motor elements of the stator52, the coil 56, the permanent magnet 60 and the inner pole piece 62. Note that the tangential motor stators are normally attached to the chuck 10. The chuck is not shown in FIGS. 7A and 7B even though the chuck would be required to hold the tangential motors stators in the configuration depicted.

Figure 6:
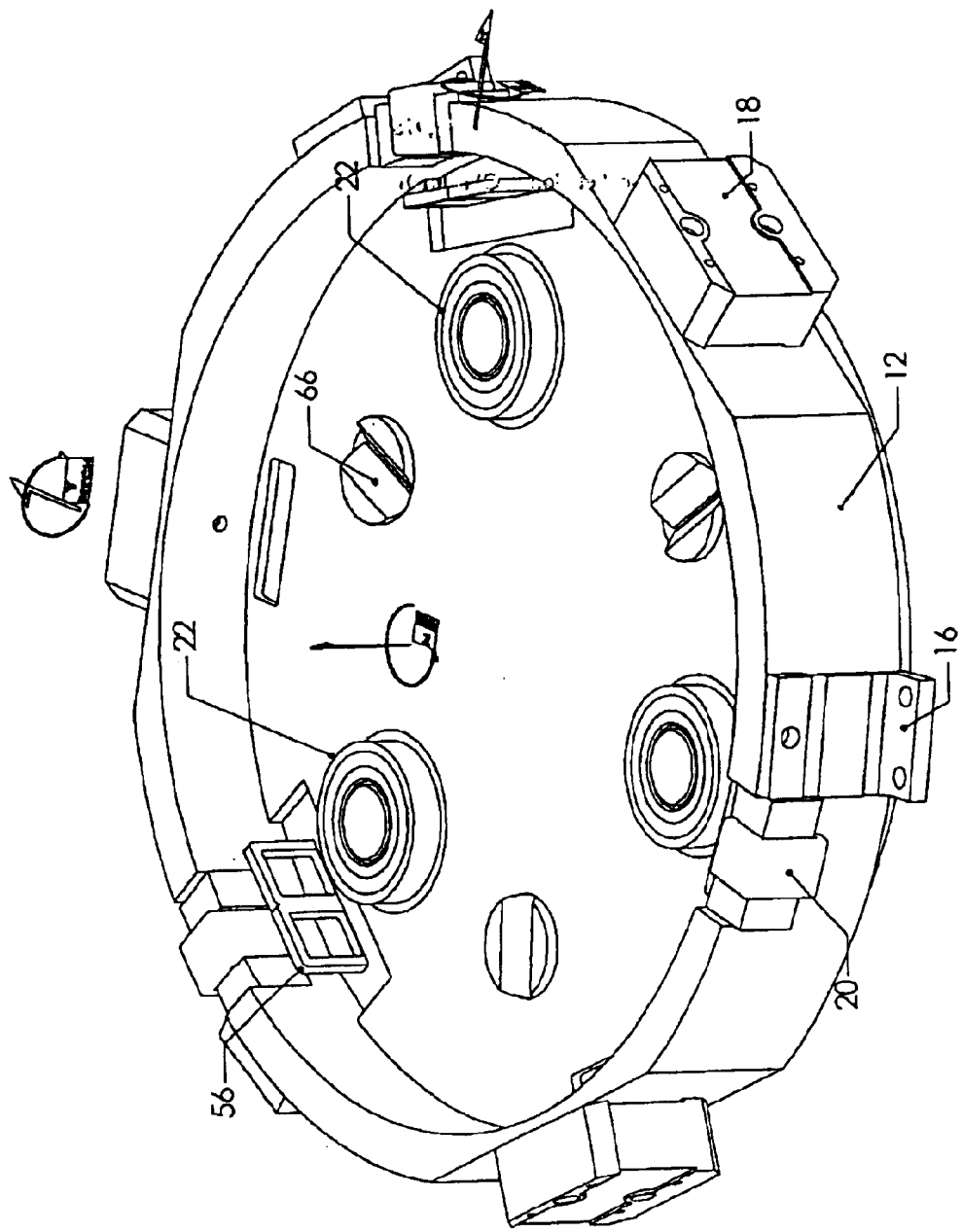
FIG. 6 shows an isometric view of the housing with the chuck removed according to the system described herein.

FIG. 6 is an isometric view of the housing 12, with the chuck 10 removed, to provide a better view of the relationship of the Z actuators 22, the flexure mounts 16, and the encoder read heads 18. FIG. 6 also shows three V shaped grooves 66, which are kinematic mounts that provide a precise registration between the chuck and housing when the air bearing pistons 22 go to the lowest, or ground state. This "home" position is used to set the initial position of the position sensors 18 when power is first applied to the manipulator. FIG. 6 also provides another view of the tangential VCM motor coil 56.

Figure 8:
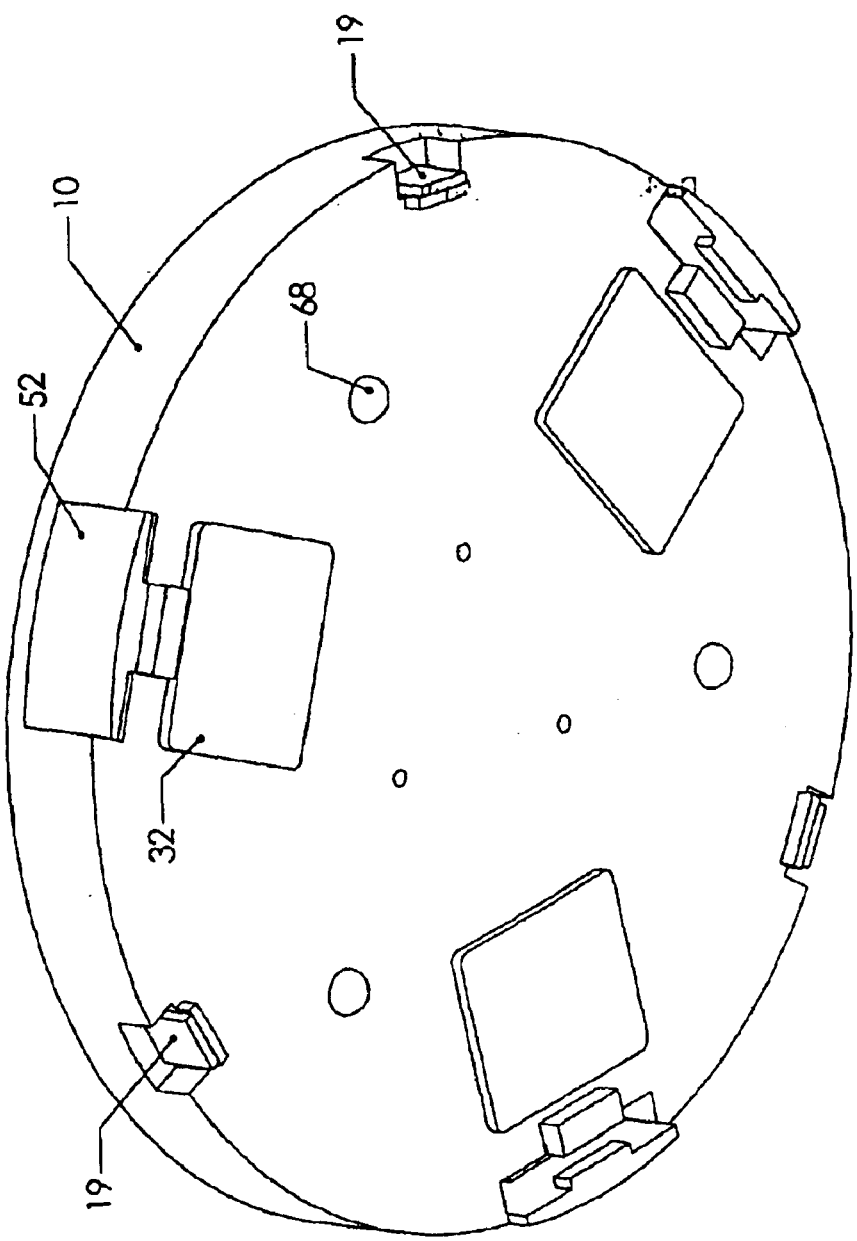
FIG. 8 shows an isometric view of the bottom of the chuck according to the system described herein.

FIG. 8 is an isometric view of the chuck 10 in isolation from the housing, to provide a better view of the relationship between the steel pads 32 on the underside of the chuck. FIG. 8 also shows the ball mounts 68 that fit the V shaped grooves 66 of the kinematic mounts. Also shown are holes in the chuck through which the lift pins 14 pass as the chuck is raised or lowered. FIG. 6 also shows the tangential motor stator piece 52 that is connected to the chuck. The position sensor patterned surfaces 19 can be seen in FIG. 8. The position sensor arrangement shown in the figure makes use of three 2-dimensional grids as the patterned surfaces.

FIGS. 9A and 9B show a different cross section view from FIGS. 5A, 5B, and 5C of the housing 12 with the chuck 10 shown in the maximum raised position. There is an other cross sectional view of one of the Z actuators 22. Also shown is a non-magnetic spacer 74 for the Z actuator 22 that drives the magnetic flux path through the steel pad 32 on the bottom of the chuck 10. FIGS. 9A and 9B show that the air bearing pad 34 may be contained in an inner steel cup 76 that completes the flux path back to the permanent magnet 44.

FIGS. 10A and 10B show a top view of the housing 12 shown with the chuck 10 removed that shows the relative positions of the parts of the Z actuator 22. The Z actuator includes a cylindrical air bearing sleeve 38, a steel piston 24 separated radially by a non-magnetic spacer 74 from an inner steel cup 76. Inside the inner steel cup is the air bearing pad 34, which is mounted on the ball pivot 36 (not shown in FIGS. 10A and 10B) to maintain planarity with the bottom of the chuck (not shown in FIGS. 10A and 10B). A distribution of the Z actuators 22, the tangential actuators 56 and the radial electromagnet actuators 50 is shown in FIGS. 10A and 10B. Note that the Z actuators may help control motion in the Z, roll and pitch directions, and that a relatively low and a constant power consumption is due to the use of pneumatics.

Figure 11:
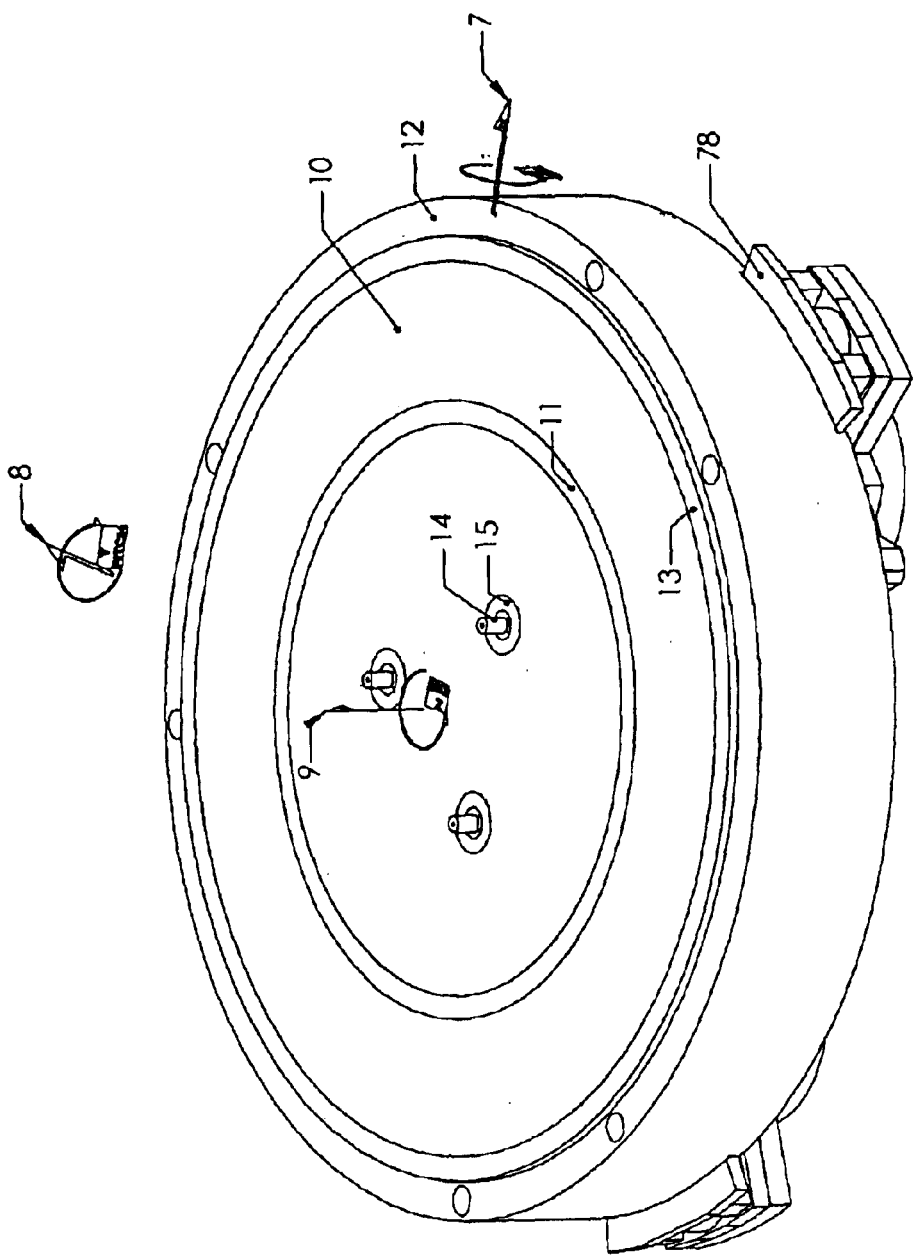
FIG. 11 shows an isometric view of an alternative embodiment of the housing and chuck according to the system described herein.
Figure 12:
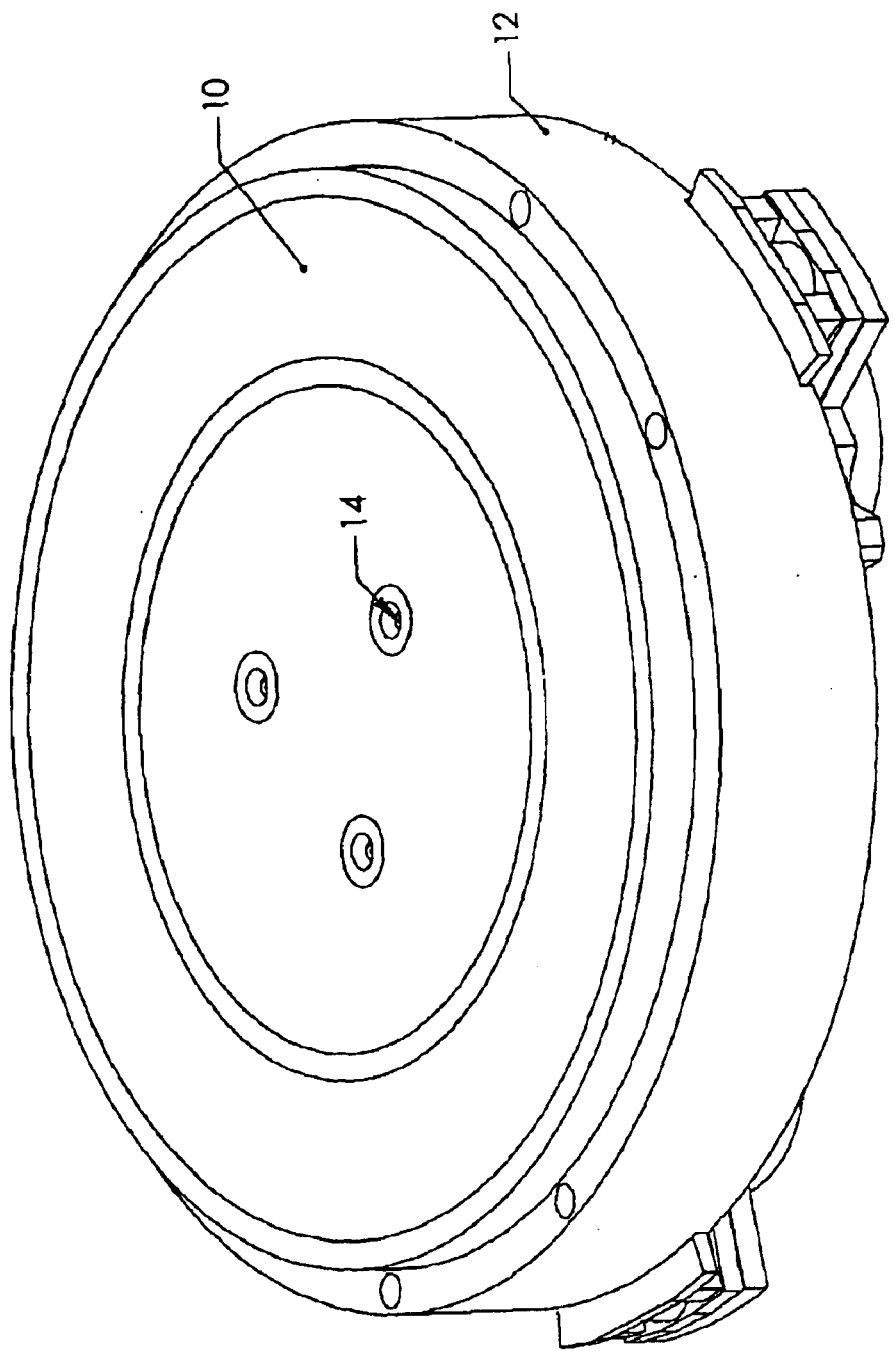
FIG. 12 shows a different isometric view of an alternative embodiment of the housing and chuck according to the system described herein.

FIG. 11 is an isometric view of an alternative embodiment of the invention. Some intended applications for the substrate manipulator have less stringent precision requirements and greater cost sensitivity. The alternative embodiment shown in FIGS. 11–19 provide four degrees of freedom of control of the chuck position with respect to the housing. The alternative embodiment eliminates the radial electromagnet actuators previously described and makes use of lower cost "linear" position sensors. FIG. 11 shows a housing 12 and chucktop 10 with lift pins 14 protruding through the chucktop surface. The housing 12 would normally be attached directly to the top surface of an XY stage. FIG. 12 shows the alternative embodiment in the raised position.

Figure 13:
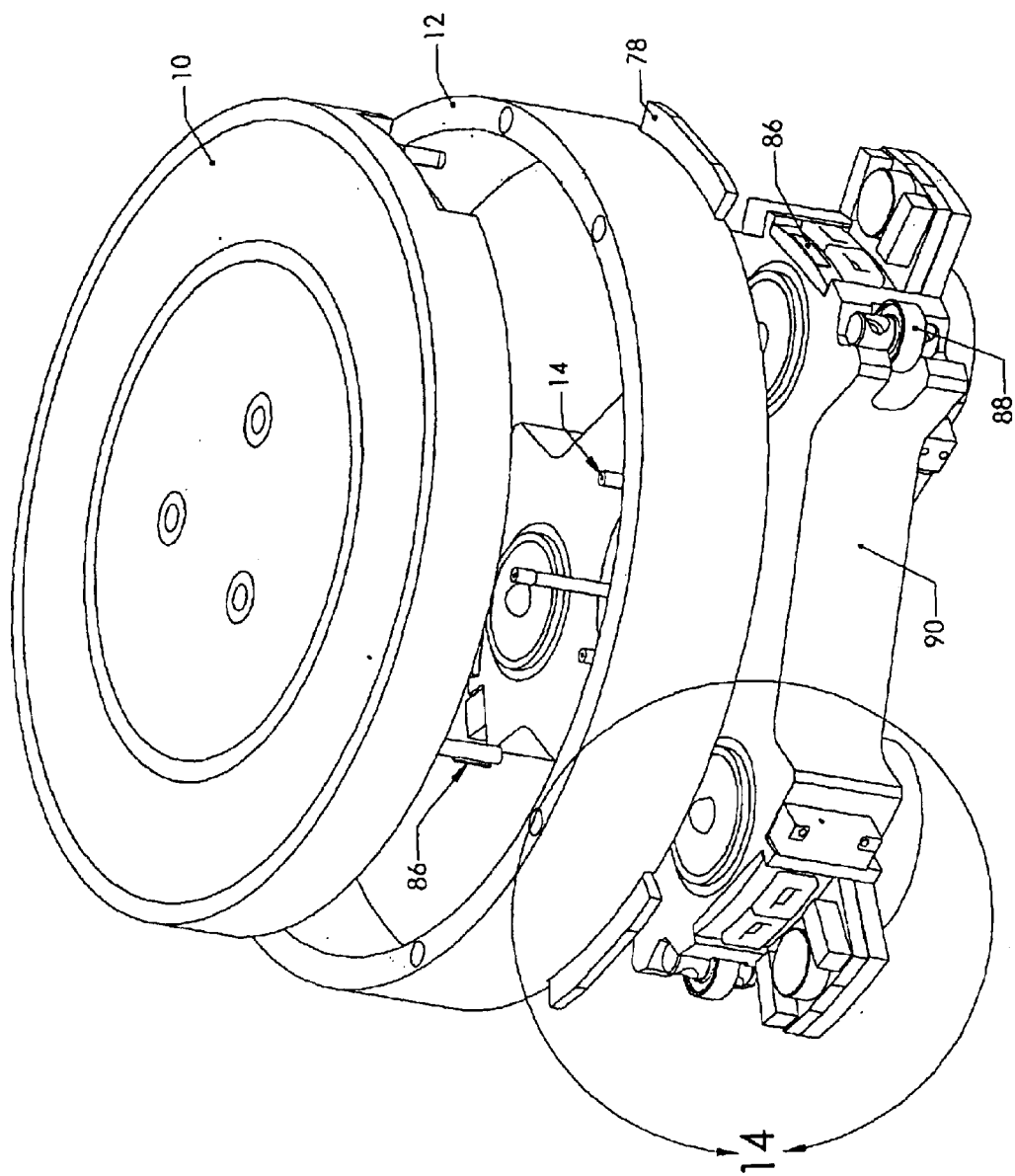
FIG. 13 shows an exploded isometric view of an alternative embodiment of the housing and chuck system described herein.
Figure 14:
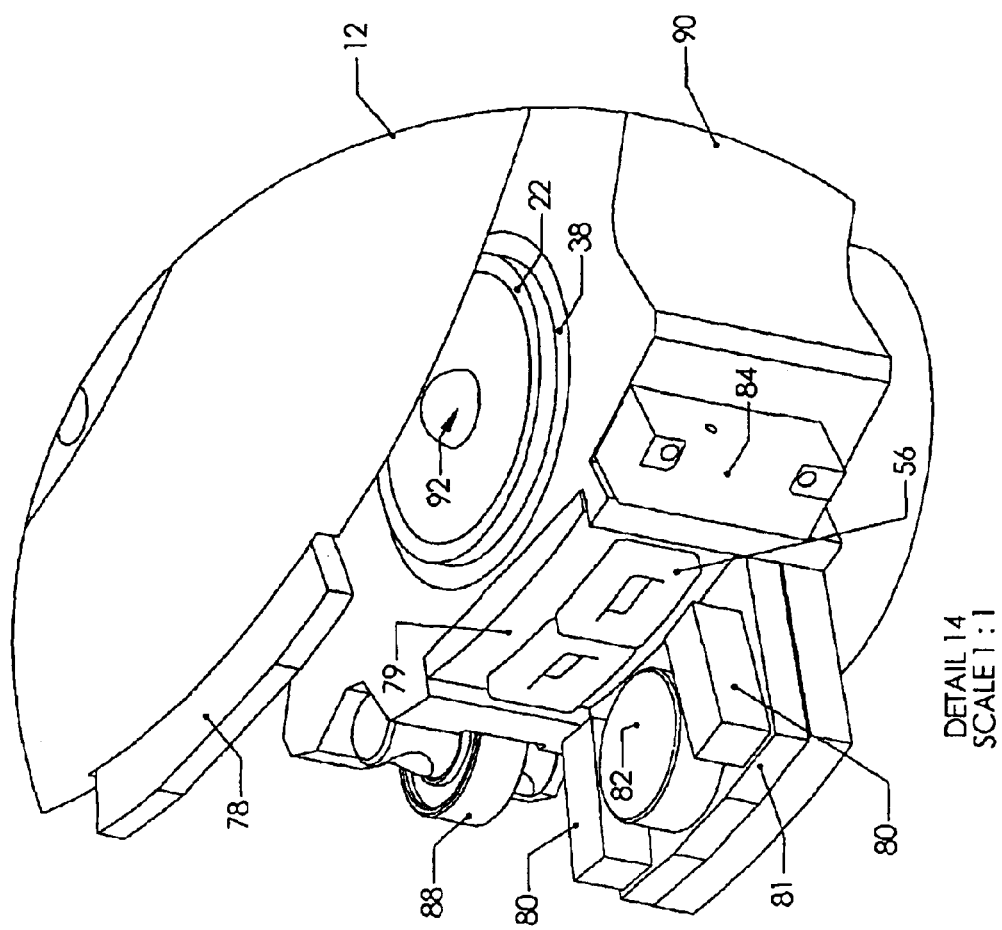
FIG. 14 shows an exploded isometric view of a portion of an alternative embodiment of the housing and chuck system described herein.
Figure 15:
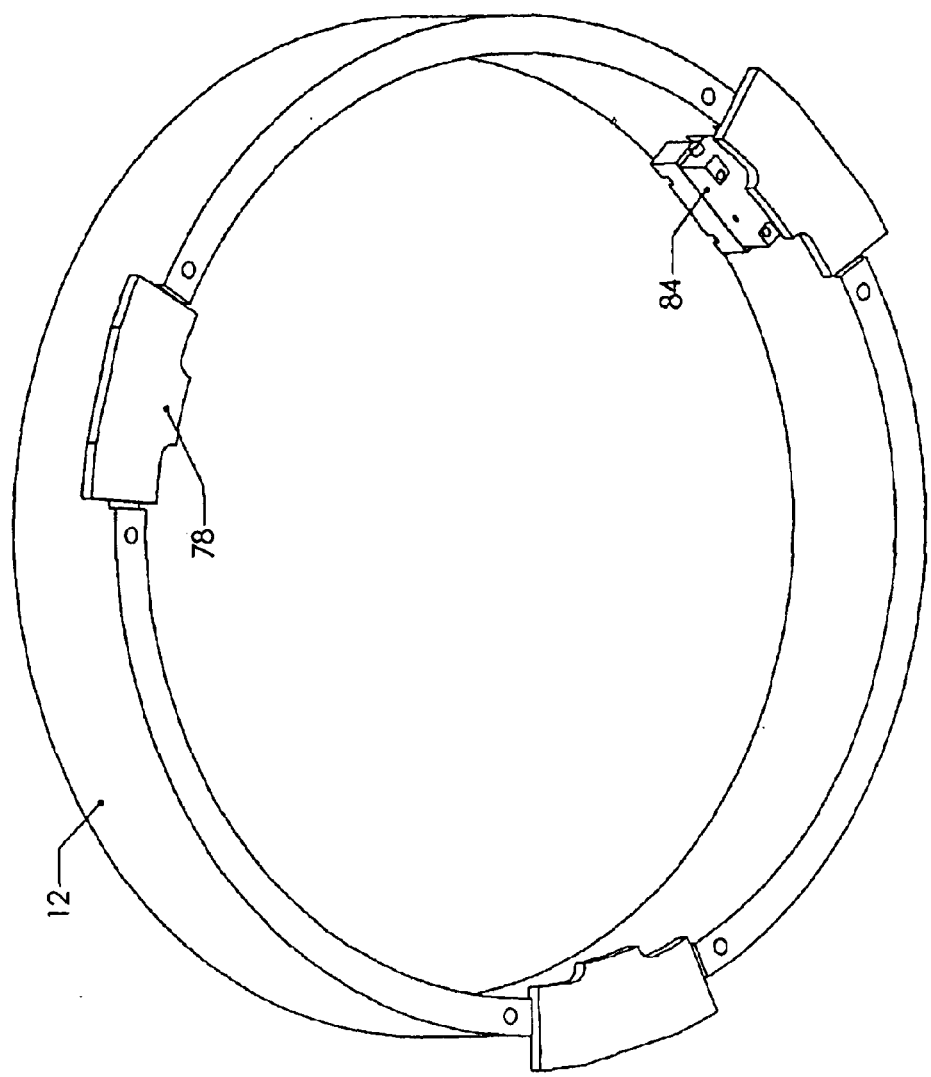
FIG. 15 shows an isometric view from the underside of an alternative embodiment of the housing described herein.

FIG. 13 is an exploded isometric view of the alternative embodiment. A hub assembly 90 is driven with respect to the housing 12 and in turn carries the three Z actuators that drive the chuck in Z, roll and pitch with respect to the hub. The hub is restricted to perform only a yaw motion by a combination of 3 magnetically preloaded air bearing pads and 2 magnetically preloaded cam followers 88. FIG. 14 shows these items in greater detail. The air bearing pad 82 is magnetically attracted against a ferromagnetic surface 78 that is attached to the housing 12. However, the pressure of the air bearing ensures that a small gap, usually less than 10 microns, exists between the surface of the air bearing pad 82 and the ferromagnetic surface 78. A pair of magnets 80, magnetized in the vertical direction provides the attractive force that preloads the air bearing against the ferromagnetic surface 78. FIG. 15 is a view of the ferromagnetic surface 78 attached to the underside of the housing 12. The ferromagnetic surface 78 includes a flux focusing region that directs the magnetic flux of magnets 80 radially inward across tangential motor coils 56 and into inner stator 79. The ferromagnetic stator piece 79 completes the magnetic path for the flux back to the underside of magnets 80. Note that magnets 80 are arranged with either both "N" surfaces up or both "S" surfaces facing up.

FIG. 14 shows cam follower 88 attached to the hub assembly. Two cam followers are provided as shown in FIG. 13 and that ride along the inner circumference of housing 12. The cam followers are magnetically preloaded against the inner surface of the housing. The magnetic flux crossing the tangential motor coils 56 also creates a radial force that acts between the hub 90 and housing 12. Normally, the symmetry of the three tangential actuators would ensure that the radial forces substantially cancel each other. With perfect symmetry, there would be no net radial force with which to preload the cam followers.

The symmetry of the three tangential actuators is deliberately upset by altering the dimensions of the flux focusing face of one ferromagnetic pad 78 relative to the other two pads. A small change in the cross-sectional area of the innermost radial edge of the pad 78 produces a large change in the radial force but only a minimal change in the force constant of the tangential motor. The unbalanced radial forces create the preload force necessary to ensure that the cam followers remain in rolling contact with the inner surface of the housing during normal expected stage motions.

The three tangential motors may be driven as if they are a single motor. Each motor produces a tangential force acting between the housing and hub assembly. The three motors may produce a yaw moment about the Z axis in order to rotate the hub assembly 90.

Figure 16C:
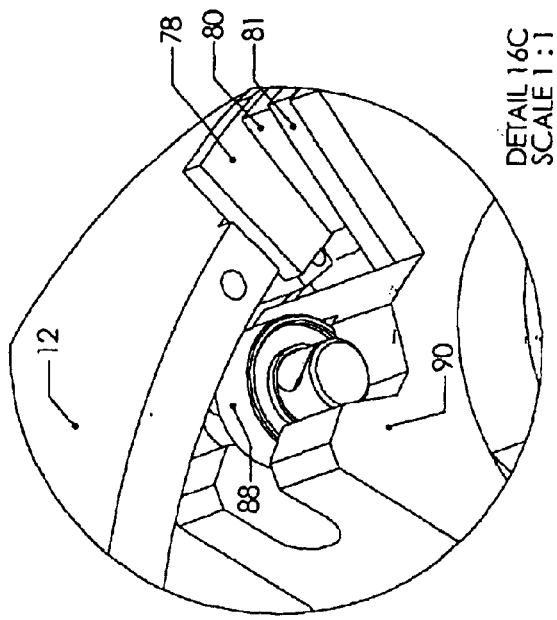
FIGS. 16A, 16B, and 16C show an isometric view from the underside of an alternative embodiment of the housing and chuck system described herein.
Figure 16A:
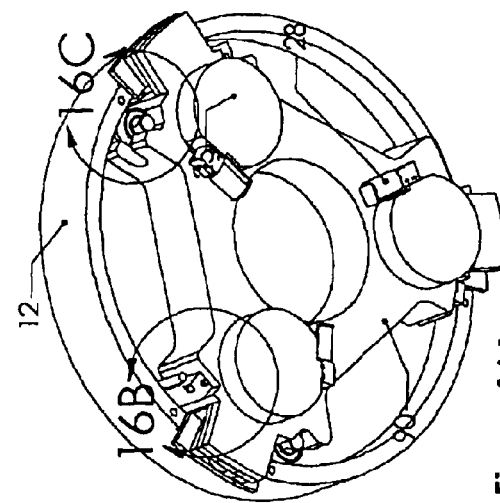
Figure 16B:
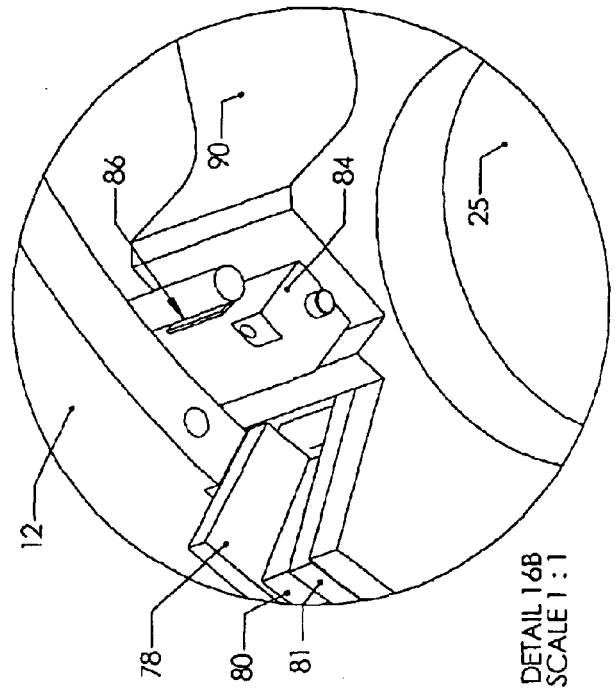
Figure 17B:
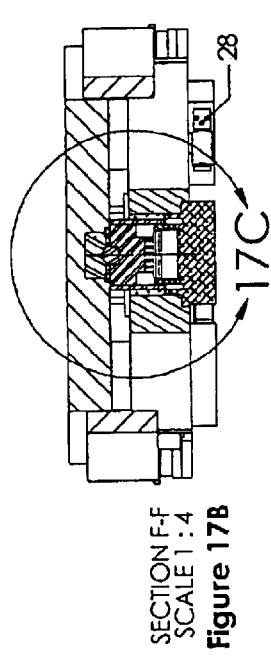
FIGS. 17A, 17B, 17C, 17D, and 17E show a cross section of an alternative embodiment of the housing and chuck system described herein.
Figure 17C:
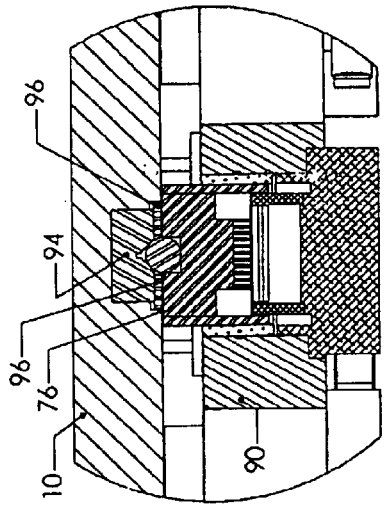
Figure 17D:
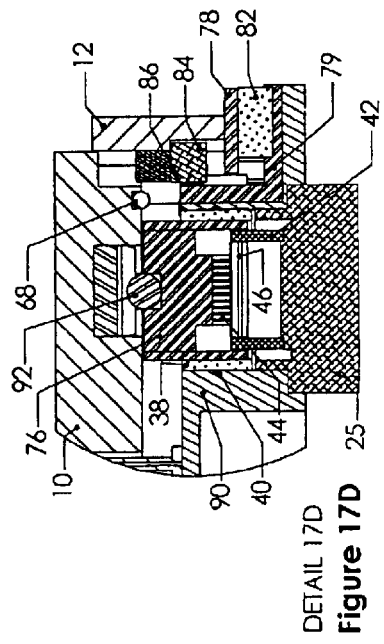
Figure 17A:
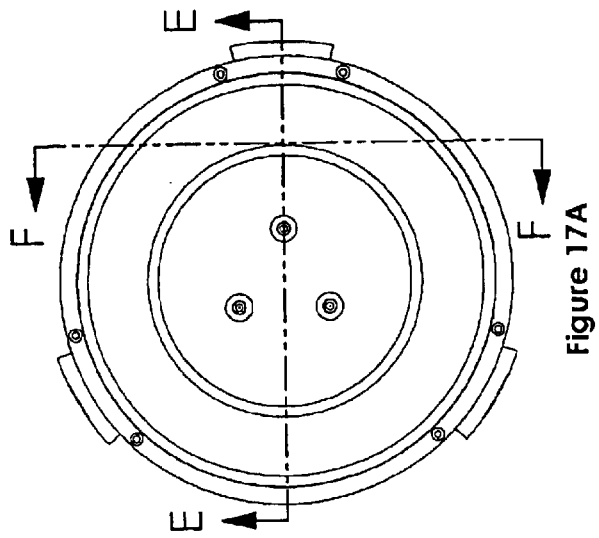
Figure 17E:
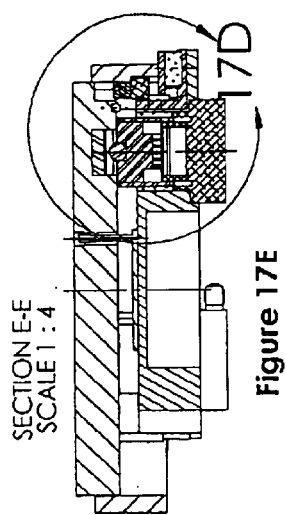

The position of the hub assembly with respect to the housing is measured using a position sensor. Numerous encoder configurations known to those skilled in the art may be used to measure the hub rotation. An encoder read head 84 is shown in FIG. 15 attached to the inner surface of the housing. A small section of flexible sensor substrate 86 may be adhesively attached to one of the inner stator plates 79 as shown FIG. 13 and in cross section in FIGS. 17A, 17B, 17C, 17D, and 17E. The same style of encoder and substrate may be used between the hub assembly 90 and the chucktop 10 to measure the chuck position with respect to the hub in the Z, roll and pitch directions. The encoder 84 may be mounted to the hub as shown in detail in FIG. 16B. The encoder substrate 86 may be attached to a dowel pin and bonded into the underside of the chucktop as shown in FIG. 16B and in FIGS. 18A, 18B, and 18C.

Figure 18B:
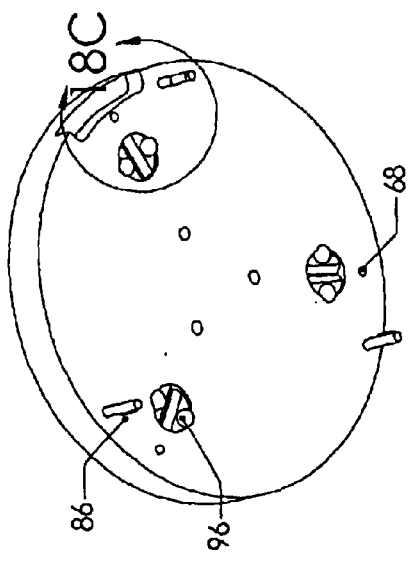
FIGS. 18A, 18B, and 18C shows an isometric view of the chuck of an alternative embodiment of the housing and chuck system described herein.
Figure 18A:
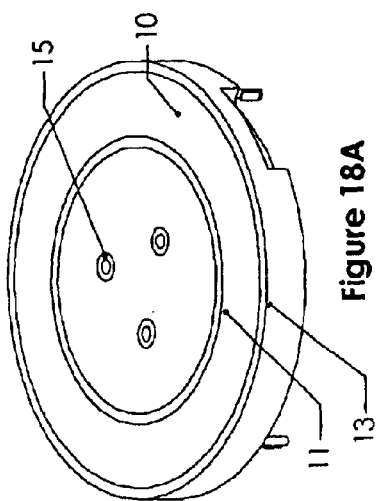
Figure 18C:
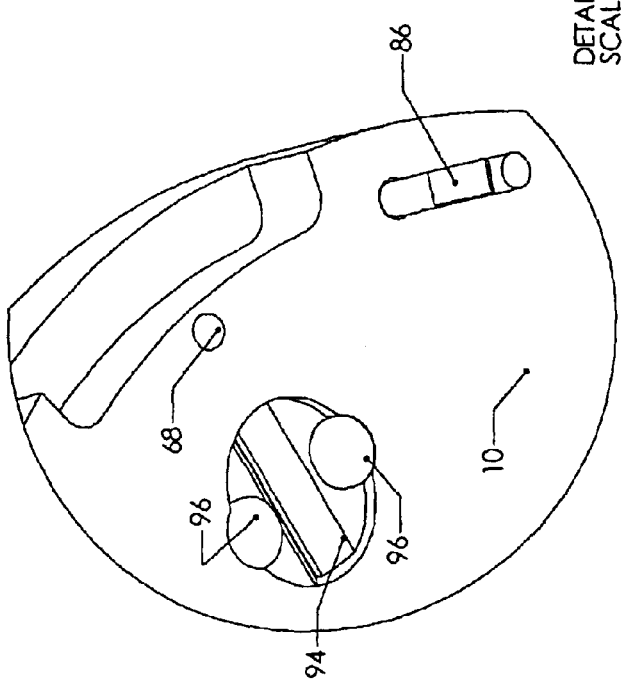

The chucktop is driven with respect to the hub assembly in the Z, roll and pitch directions using three Z actuator assemblies 22. In the alternative embodiment the three Z actuators incorporate magnetically preloaded kinematic mounts consisting of a ball 92 fixed in the top of the piston 24 that makes contact with Vee-block 96 fixed in the underside of the chucktop. Alternative configurations of kinematic couplings may be obvious to one skilled in the art. Preload magnets 96 are bonded to the ferromagnetic Vee-blocks 94 with opposing polarity. The kinematic ball 92 is preferably ceramic or similar non-magnetic material in order to avoid fretting corrosion with the ferromagnetic Vee-blocks. Alternatively, the flux from the permanent magnet 44 used in the voice coil motor portion of the Z actuator could be exploited to create the magnetic preload. However, the magnitude of force required to achieve sufficient preload to withstand anticipated stage motions may be substantially lower than the force that was required in the previously described embodiment in order to properly preload the air-bearing pad. The substantially smaller preload may be better obtained by use of relatively small permanent magnets 96 as shown in FIGS. 18B and 18C.

The home position for the three Z position sensors 84 may be established using a kinematic mount between the chucktop 10 and the hub assembly 90 that may be engaged at the extreme bottom of stroke of the Z actuators. A preferred embodiment of the kinematic mount may be realized using three balls 68 that make contact with three horizontal surfaces of the hub assembly. The balls 68 are visible in FIGS. 18B and 18C and in cross section in FIGS. 17A, 17B, 17C, 17D, and 17E. The balls 68 make contact with the top surface of the inner stator plate 79. The three balls in contact with three flat surface provide constraints for the three degrees of freedom that exist between the hub and the chucktop. Alternatively, a switch or other sensor may be used to provide a home sensor for the encoders. The kinematic constraint shown in FIGS. 17 and 18 has the advantage of simplicity, low power and low cost versus alternative home sensing solutions.

A controller is used to control the chuck system with respect to the housing. The control system converts between various coordinate systems, such as Cartesian and polar. The control system manipulates data from various points of view, such as the user, the substrate being handled, and the significant points of the tools in which the chuck is being used, such as the center of an optical system in an imaging system. The user may initiate (i.e., command) motions of the chuck in a coordinate system that may be considered as if the chuck were "embedded" in the "focal plane" of the imaging system tool. A primary purpose of the chuck in the embodiment illustrated herein is to bring a substrate into alignment with the imaging system tool. Sensors in the imaging system tool may observe deviations from alignment (for example, out of focus, or out of the focal plane). The deviations from the desired position and attitude of the wafer with respect to the alignment tool results in the tool (i.e., the user in this illustrative example) issuing commands to the chuck controller to compensate for the observed deviation. There are many well known coordinate systems that could be used for moving the handler. A preferred system is a Cartesian coordinate system that is parallel to the focal plane of the tool and aligned with the tool's definition of X and Y. The Z=0 plane of the coordinate system lies in the focal plane of the image of the tool. The advantages of selecting such a "tool-centered" coordinate system includes the convenience of expressing rotations to the chuck without introducing XY translations to the flat stage upon which the chuck and its housing moves.

Thus, in a preferred embodiment, the control system may use a "body-centered" coordinate system that is distinct from the user coordinate system. The body-centered coordinate system is preferred due to the well-known principle that the equations of motion of a rigid body are decoupled when the equations are expressed in a coordinate system located at the center of mass of the body and oriented along the principle directions of the body. Thus, the six degrees of freedom (i.e., 6-DOF) in the body-centered coordinate system of this illustrative embodiment enables the control system to be comprised of six 1-DOF controllers. Similarly, the three degrees of freedom in the body-centered coordinate system of this illustrative embodiment enables the control system to be comprised of three 1-DOF controllers and the four degrees of freedom in the body-centered coordinate system of this illustrative embodiment enables the control system to be comprised of four 1-DOF controllers. This is an advantage when the controllers are non-linear, since saturation of the actuators and limits on maximum velocity may force the controllers to become non-linear. It is far easier to apply non-linear control to a 1 DOF system than to try to handle non-linearity inside a strongly coupled multi-DOF controller.

The controller in this illustrative embodiment of the invention controls the chuck (or handler) in what are known as the six degrees of freedom (i.e., 6-DOF), which are the three dimensions of normal space, X, Y and Z, and the rotations around those three axis, known as roll, pitch and yaw respectively. The six directions result in what are known as six body forces that are applied to the handler to obtain the motions. In addition, the motions may be either high frequency motions or low frequency motions. The six body forces in the handler or chuck are produced through the control of a combination of 12 currents. There are three Z voice coil magnet (i.e., VCM) currents, three radial electromagnet (i.e., EM) currents, three tangential VCM currents, and three currents in the valves that regulate the pressure in the Z cylinders (VSO current). The body force controller generates the best set of the twelve control signals in order to efficiently deliver the overall body force needed.

Alternative embodiments shown herein control the chuck in either three degrees of freedom or four degrees of freedom, which is a straight-forward adaptation of the six DOF system illustrated herein.

In general, a set of control signals includes the use of the pneumatic systems to maintain a low power dissipation for relatively constant loads, the use of the EM actuators rather than the VCM actuators when possible to keep power dissipation as low as possible, the separation and combination of high frequency from low frequency actuators, and the use of magnetic preloads and passive air bearings in conjunction with use of differential mode operation when possible to keep the power dissipation level as constant as possible. The following discussion is an illustrative example of how to use the above noted general features in a control system that achieves the goals of the present arrangement of highly accurate, fast and reproducible movement of a substrate with low power dissipation and constant power dissipation.

The chuck manipulator controller is an element of the control system. The chuck manipulator controller provides the function of closing a position servo loop and responding to user position commands. The controller follows the conventional form of a state-space controller with full-state observer. Those skilled in the art will recognize in FIG. 19 the role of the block labeled "bPos_Ctrl" as the block in which the controller is implemented. The block labeled "bObserver" provides the estimate of the state variables in response to measured position (from 6 position sensors) and (known) force applied to the manipulator ("bF_actual").

The block labeled "User_J_bPos" is used to transform from the user coordinate system to the body-centered coordinate system. The transformation is in general non-linear due to the presence of rotations. However, the range of rotation in the intended application of the manipulator allows for a linearized transformation based on small angle assumptions. It is important to remember that the primary application for the manipulator is for aligning a substrate to a tool. In this situation, any inaccuracy induced by the linear approximation to the non-linear coordinate transformation (however small) is corrected by the closed loop auto-focus, auto-planarize and auto-align features of the tool.

Figure 19:
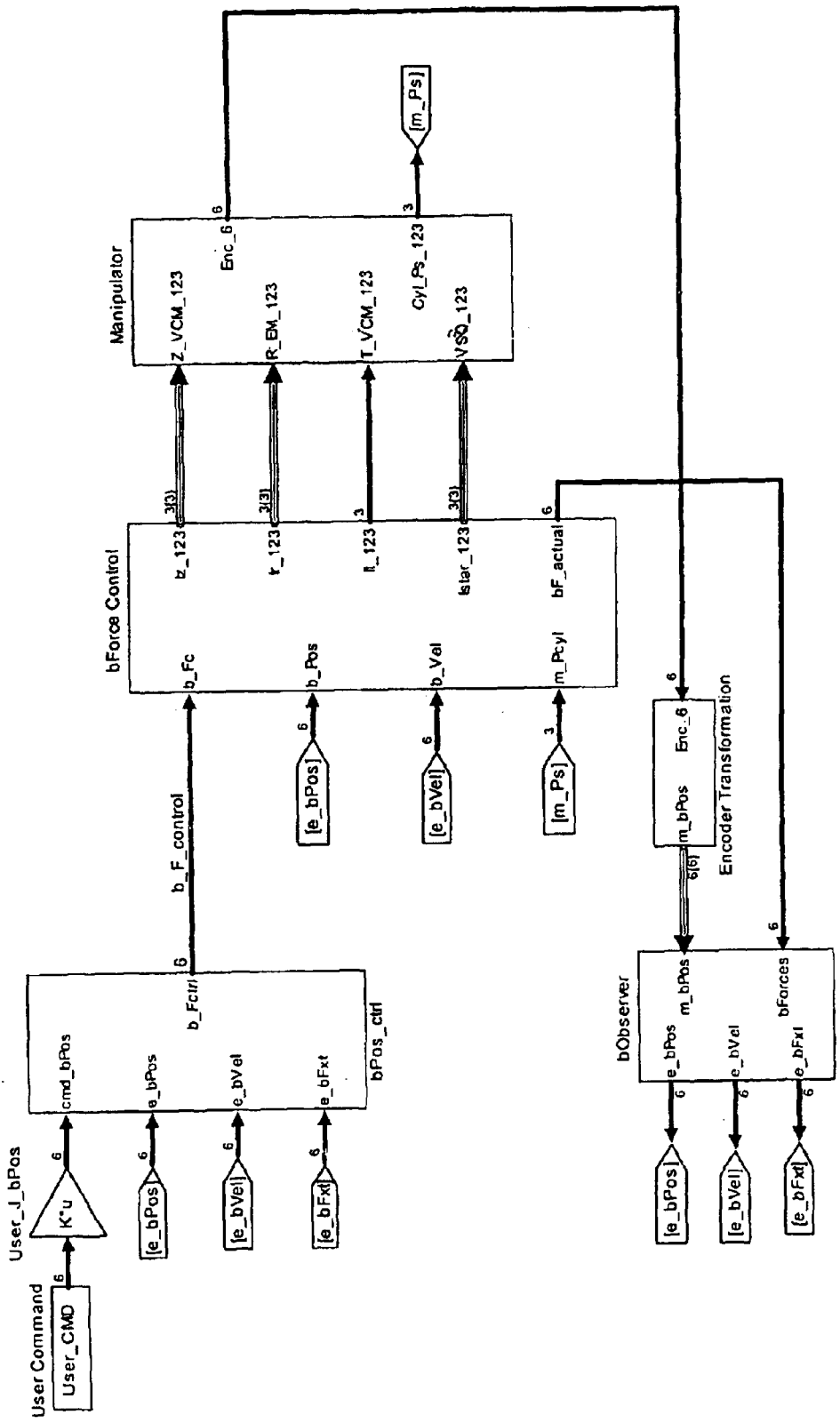
FIG. 19 shows a block diagram of a chuck controller according to the system described herein.

The nomenclature used in FIG. 19 follows a simple convention. A lowercase "b" prefix indicates that the signal ("bF_actual" for example) is referenced to the "body" coordinate system. Note that there are multiple coordinate systems present in the manipulator. The tool commands the manipulator in the "user" coordinate system. The encoders sense the chuck position with respect to the housing in the "encoder coordinate system". The Z actuators apply bZ, bRoll and bPitch forces (moments) by forming sums and differences along the [Z1, Z2, Z3] vector directions. The tangential motors apply bFx, bFy and bYaw forces (moments) through sums and differences along the [T1, T2, T3] vectors.

The radial electromagnets apply radial forces along the [R1, R2, R3] directions. The "R" directions nominally span the 2D Cartesian directions [bX, bY]. Since 3 "R" directions map into 2 body directions there is some redundancy. This redundancy is exploited to compensate for the inability of the radial EM motors to provide negative force (electomagnets can only "pull", they cannot "push"). The radial EM motors do not pull directly in-line with the body center of mass (CG). The radial motors produce a slight un-intended bRoll and bPitch moment in the course of producing the desired bFx and bFy forces. This issue, as well as the partitioning of forces between the (slow, efficient) radial EM motors and the (fast, less-efficient) tangential motors, is handled in the block labeled "bForce_Control".

Six body forces in the manipulator are produced through the control of a combination of 12 currents: (3) Z VCM currents, (3) Radial EM currents, (3) Tangential VCM currents and (3) currents in the valves that regulate the pressure in the Z cylinders (VSO current). The function of the body force controller is to generate the best set of 12 control signals in order to efficiently deliver the body force that is requested by the control law (b_F_control).

Figure 20:
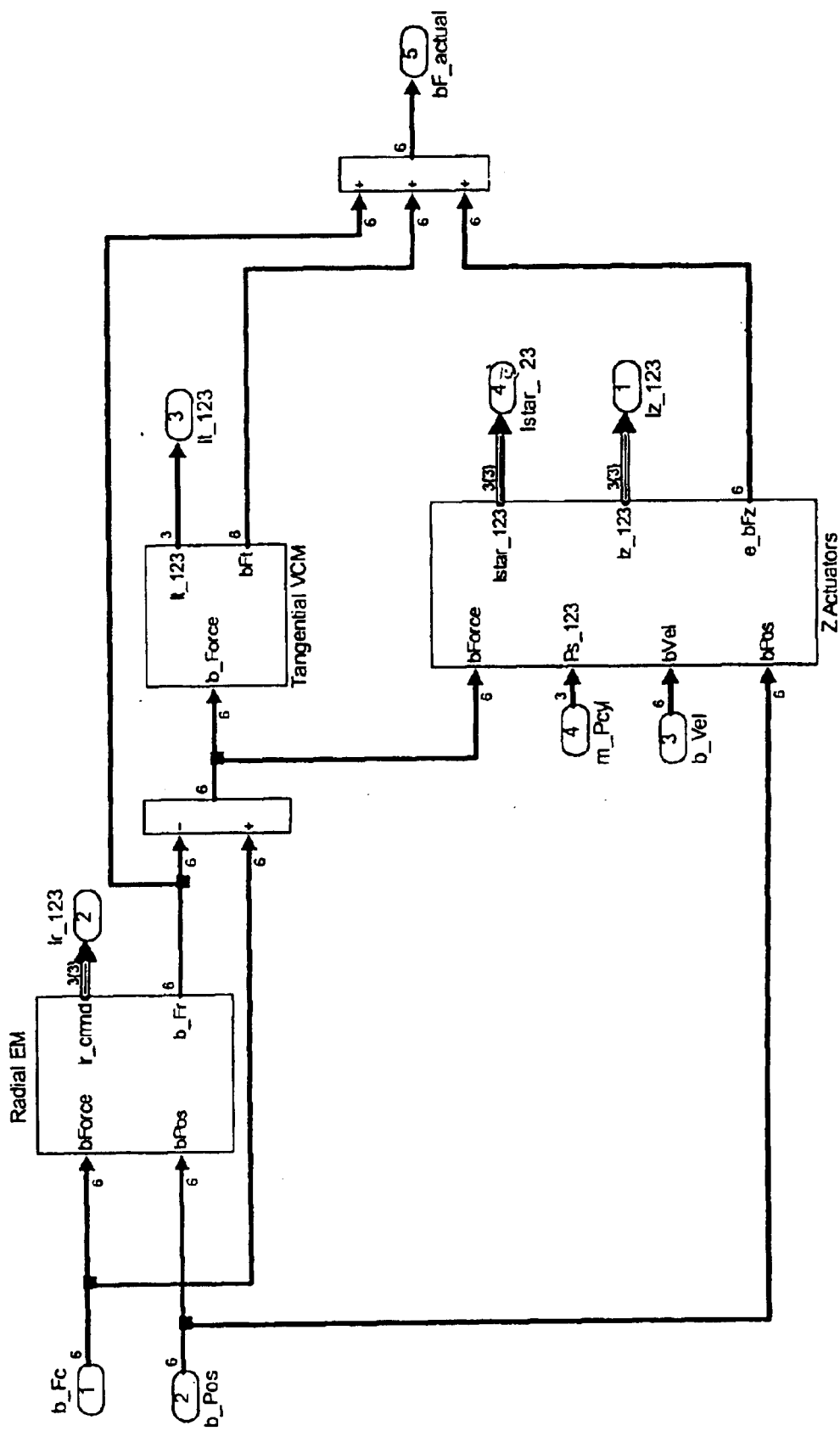
FIG. 20 shows a block diagram of a radial, tangential and vertical force controller according to the system described herein.

FIG. 20 reveals how the 12 currents are determined in response to a 6 DOF bForce command. The 6D command for a body force appears in the upper left corner of the figure ("b_Fc"). The 6D body force is "issued" to the radial EM controller. Only a subset of the body force can be generated by the radial EM controller. Also, the modest bandwidth of the radial EM amplifiers (300 Hz, for instance) will prevent the radial EM controller from producing all of the requested force. Finally, since the radial EM motors do not act directly at the body CG, they will produce moments about the body X (Roll) and Y (Pitch) axes.

The radial EM controllers produce a signal ("b_Fr") that is the actual body force produced by the radial EM. This signal will contain some residual bFx and bFy components due to the limited bandwidth of the radial EM. Also, it will contain the original bRoll and bPitch moments along with the algebraic addition of the Roll and Pitch moments "inadvertently" created by the radial EM motors. Note that the net bRoll and bMoments may be larger or smaller in magnitude than the initial b_Fc command due to the effect of the radial EM motors.

The net body force produced by the radial EM motors is subtracted from the original body force request. The remaining body force (which will typically contain a small component in the X and Y directions and relatively larger components in the Z, Roll, Pitch and Yaw directions) serves as the command to the Tangential VCM controller and the Z actuator controller.

In the general case, the residual body force (after the radial EM forces are subtracted from the initial body force) would be applied to the tangential motors, the net body force computed and a new residual body force computed and used as the input to the Z actuators. The tangential motors and the Z actuators are known a priori to be mutually orthogonal. There is no component of the 6D body force that can be produced by the tangential motors that could also be produced by the Z actuators (and vice versa). In this case, there is no loss of generality to apply the residual force (after the radial EM controller) to both the Tangential VCM controller and Z Actuator Controller. The transformations within each controller that transform the 6D body force vector into the respective 3-tangential directions and 3-Z-actuator directions ensure that there is no coupling between the tangential and Z-actuator directions. It should also be mentioned that the 3-tangential and 3-Z-actuator directions collectively span 6-space. Thus the combination of "T" and "Z" 3D force controllers is sufficient to span the required 6-DOF space encompassed by the body force vector. However, there still remain issues of actuator saturation and finite bandwidth within the Z-actuators. These issues will be discussed momentarily.

The effect of actuator saturation and finite bandwidth is to limit the available net body force produced to something less than the initial request. The net actual body force is computed by the vector sum of the body forces produced by the radial, tangential and Z-actuators. This actual body force is used in the state estimator as the "known" input to the plant model (well known to those skilled in the art). The actual body force will be identical to the b_F_control signal that originated from the control law under most circumstances. If an actuator is saturated and therefore unable to deliver the necessary force, the observer will be better able to estimate the proper state variables due to the use of the saturated body force signal (which is a better indication of the known force applied to the manipulator than the original).

Figure 21:
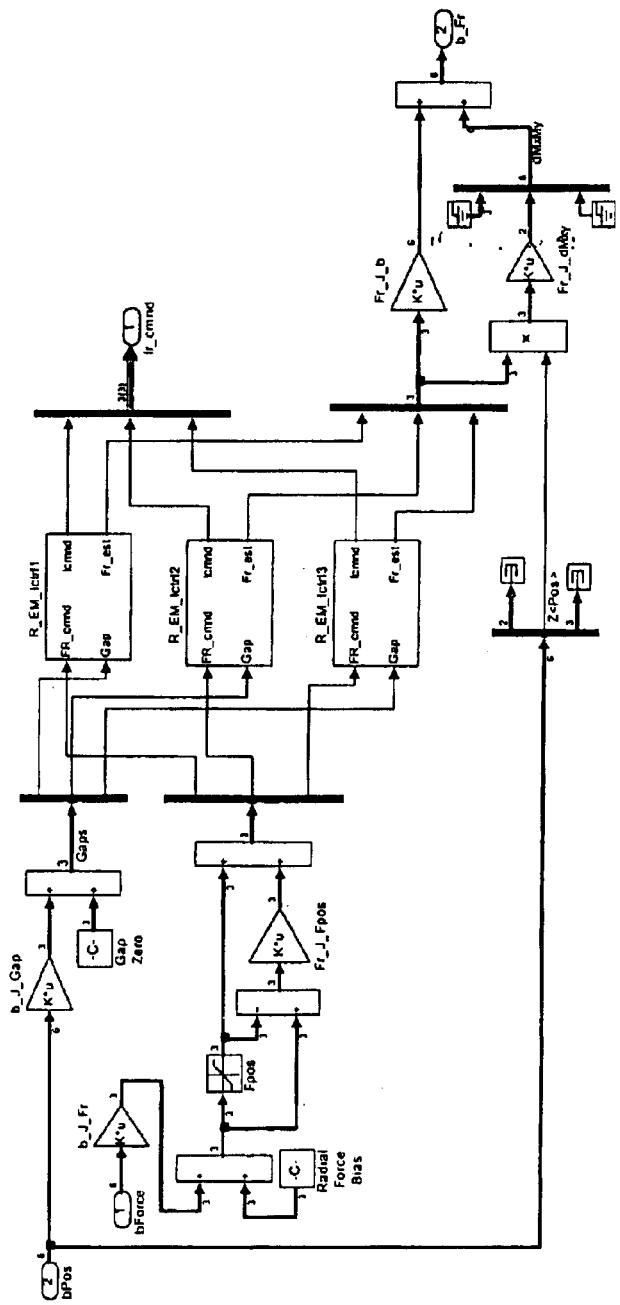
FIG. 21 shows a block diagram of a radial force controller according to the system described herein.

The radial force controller is shown in FIG. 21. The (6D) body force command appears at the left of the figure ("bForce"). The relationship between force and current in an electro-magnet is a function of motor parameters, coil current and the air gap. The gap calculation is a function of the body position (suitably transformed) and the initial gap that is present when the body position is "zero".

The radial EM motors are operated at a nominal bias force. The nominal bias serves to minimize fluctuations in power dissipation amongst the radial motors. Electromagnet actuators are only able to generate an attractive force, which is considered positive in this illustrative embodiment. To generate a negative force, the opposing pair of EM actuators must each generate −1 times the "negative" force (which becomes a positive force for the opposing pair of EM motors). It helps to bear in mind that the three radial EM motors act along radial directions equally spaced around the Z axis of the chuck (i.e., the center of the chucktop). A force of "−1" along the direction of a first one of the radial EM motors cannot be produced directly by the first radial EM motor. Rather, the second and third radial EM motors must each produce +1 units of force in their respective directions. The vector sum of +1 along each of the directions of the second and third radial EM motors sums to a net force of "−1" along the direction of the first radial EM motor. The power dissipated in an electromagnet is directly proportional to the force generated (in contrast to a VCM where the power is proportional to the square of the force). The radial EM motor will dissipate constant total power as long as the sum of the radial forces is constant.

In the absence of a bias force, the nominal force (and therefore power dissipated) amongst the three radial EM motors is zero. As the stage that supports the manipulator moves, the radial EM motors will generate forces (and thereby power dissipation) in response to the stage motion. There will be a net change in total power dissipation between when the stage is resting (dissipation=zero) and when the stage is operating (non zero power).

Consider the addition of a bias force of 10 newtons acting along each radial actuator. The vector sum of the radial bias force produces zero net body force (the bias forces "lock-in" a strain within the chucktop). There will be non-zero quiescent power dissipation (even while the stage is not moving) in proportion to 10+10+10=30N.

Consider the case where, in response to stage acceleration, a net body force of −1 newtons in the Y direction is required. Reducing the bias force of a first one of the radial EM motors (aligned along +Y direction) by 1 newton could produce the desired net force of −1 newton in the Y direction. However, the total power dissipation would now be proportional to 9+10+10=29 newtons. The same net force could also be produced by driving the first radial EM motor at (10−2/3) newtons and the second and third radial EM motors at (10+1/3) newtons each. The net force in the Y direction is still (−2/3−0.5(1/3+1/3))=−1. The total power dissipated would be proportional to (10−2/3)+(10+1/3)+(10+1/3)= 30 newtons.

To summarize, it is possible to exploit the redundancy inherent in the 3 radial EM motors (that collectively span only 2D space—X,Y) to achieve a $2^{nd}$ objective beyond simply generating a net force. In the case of the wafer manipulator, the additional objective is constant power dissipation. This capability ensures that the manipulator will always dissipate the same total power regardless of the stage duty cycle. It is preferable in some instances to dissipate a constant power than to dissipate power that varies in response to stage duty cycle. While any power dissipation is undesirable, the precision of a stage is far more tolerant of constant (albeit modest) power dissipation than it is to varying power dissipation. Note that the choice of bias force could be made in anticipation of the range of maximum force required, for example due to expected stage acceleration. A bias of 10N is reasonable for the typical mass and stage acceleration expected of a wide range of applications, such as in the semiconductor fabrication area. The total power dissipated from the three radial EM motors operating at a bias of 10N may be less than 1.2 watts.

The cluster of blocks at the middle left of FIG. 21 is responsible for introducing a force bias and ensuring that the force supplied by a single EM motor is non-negative. If an EM motor is required to produce an incremental negative force larger than the force bias, the EM motor force is limited to zero and the balance is produced by the opposing pair of EM motors (½ each). Under these conditions, the total net force is achieved, but there is an attendant increase in power dissipation. This condition may not be reached if the bias force is set properly.

Figure 22:
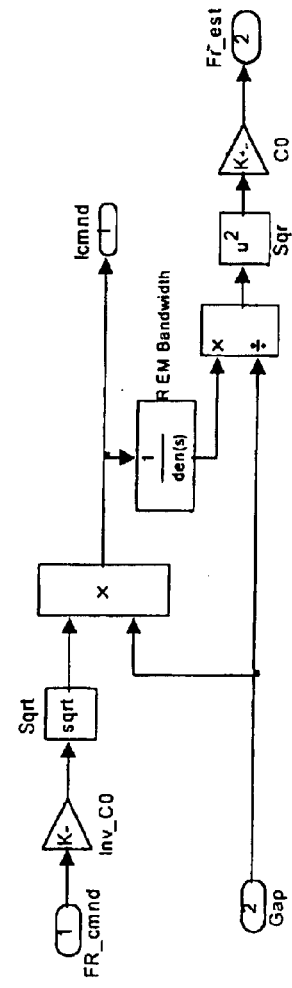
FIG. 22 shows a block diagram of a radial motor controller according to the system described herein.

Once the desired force for each radial EM motor is determined, the current required to generate the force can be easily determined, as shown in FIG. 22. The force produced by an EM motor is simply: $F=C*(I/gap)^2$. This is easily inverted to determine the desired coil current.

The EM controller must also produce an estimate of the actual force that is generated. The actual force may differ from the desired force due to the finite bandwidth of the EM amplifiers. The first order model of the radial EM motor response to a current command provides a reasonable estimate of the actual current in the EM coil. A transconductance amplifier with well-known dynamic characteristics produces the actual coil current. Using an open loop model of the amplifier/coil dynamics may be preferred over the alternative of measuring the actual coil current since any measurement of coil current may be subject to quantization effects due to the use of an A/D converter. The noise produced by the quantization may be introduced into the body force calculation, which in turn could influence the current in the tangential VCM motors. Since the tangential VCM motors are operated at high-bandwidth, the use of measured coil current could degrade the noise performance of the manipulator. In this application, some error in predicted radial force (due to slight uncertainty in the estimated motor force) is preferable to injecting high frequency noise into the system.

Another task for the radial EM force controller is to estimate the net body force actually produced in response to the command. The net body force may be due to the (bandwidth limited) actuator force as well as the effect of the force being applied at a location other than the CG of the body. Any non-zero net force in the XY plane due to the radial EM motors may also produce a Roll or Pitch moment. These moments are compensated by the Z-actuators in order to achieve the net 6D body force needed for the decoupled control algorithm.

Figure 23:
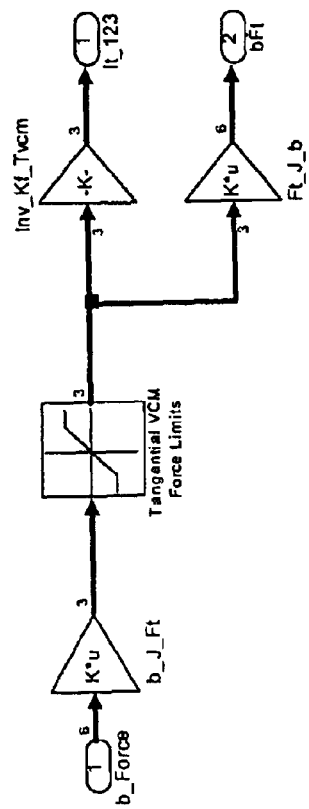
FIG. 23 shows a block diagram of a tangential motor controller according to the system described herein.

FIG. 23 shows that the tangential motors produce force in direct proportion to the coil current: $F_t=K_t*I$. However, the motors may be subject to saturation. The desired force may be limited to the maximum tangential motor force under certain circumstances. The actual (possibly limited) force may be expressed in the body coordinate system and summed within the overall body force controller to determine an actual net body force.

Figure 24:
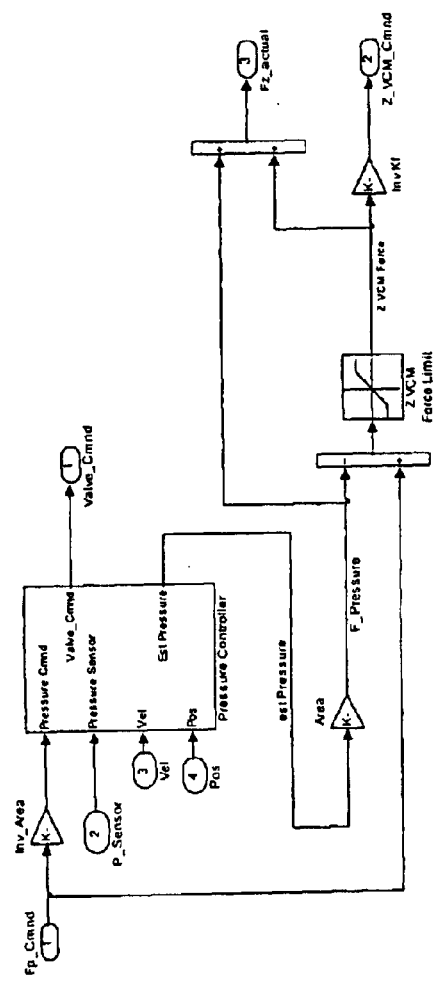
FIG. 24 shows a block diagram of a Z actuator force controller according to the system described herein.

FIG. 24 illustrates how the force required of each Z actuator is apportioned between the pressure actuator and the integral voice coil motor. The desired force to be delivered from a single Z actuator appears as the input "Fp_Cmnd" at the upper left of the figure. The force request is converted into an equivalent pressure by dividing by the cross-sectional area of the piston ("Inv_Area"). This signal is used as the command for the pressure controller.

The operation of the pressure controller will now be explained. At any instant in time, the net force delivered by the Z actuator is the sum of the pressure force due to the pressure in the cylinder (i.e., pressure times cylinder cross-sectional area) and the voice coil force due to any current in the VCM windings (i.e., current "I" times motor constant "Kf"). The request for Z force is first applied to the pressure controller. The pressure controller may attempt to deliver all of the required force. The actual force due to the pressure, which may not be equal to the requested force, is subtracted from the original force request. The voice coil motor may be used to provide the remainder of the required force. If a large, rapidly changing force is requested, the pressure controller may not be able to change the pressure sufficiently fast to follow the request and a large "force error" may be applied to the VCM. The VCM, however, is subject to saturation. The VCM force limits may be detected in the controller before the physical actuator is sent into saturation.

The pressure controller may be implemented in a classical proportional plus integral ("PI") configuration. The pole corresponding to the integral term of the controller determines the range of frequencies over which the pressure servo will provide the requested force. At DC, the integral action provides that there is no error in the pressure servo. This implies that (at DC) there is no force supplied by the VCM. At low frequencies (up to 40 Hz, for example), the majority of the force request may be satisfied by the pressure servo and very little force may be delivered by the VCM.

When large step movements are required in the Z direction, there may be a sudden, large step in the force command. The pressure controller may not be able to respond instantly to the command and the majority of the initial force step may be applied to the VCM motor. If it is sufficiently large, the VCM motor may saturate.

Within a few milliseconds, the pressure in the cylinder will start to change in the appropriate direction to satisfy the request and the current in the VCM motor will decay rapidly. Since there is no DC current in the VCM (due to integral action in the pressure controller) and the large currents encountered during steps decay rapidly, there is negligible average power dissipation in the VCM coils. If the Z actuators were required to make large, rapid and frequent force changes, the VCM motors would experience heating. However, this is not the typical case for the intended application of the wafer manipulator mechanism.

Even if large external loads are applied to the stage (which require corresponding large DC forces in the Z actuators), the entire load is supplied by the pressure controller after a small fraction of a second. Wafer probing is an application with large quasi-DC loads. When the wafer is brought into contact with the probe pins, a large force may be applied to the chuck. Probe forces can be very large relative to the gravity force due to the chuck and substrate mass. Some non-semiconductor applications may involve substrate masses that are a significant fraction of the chucktop mass. A large quasi-DC force (change) is required when such a substrate is loaded/unloaded from the stage. These large quasi-static loads are easily handled by the manipulator without excessive heating due to the apportioning of the force between the high-frequency small force capabilities of the VCM and the low-frequency, large force capabilities of the pressure cylinder.

Note the similarity between the bandwidth partitioning between the radial and tangential motors and the partitioning within the Z actuator. The large amplitude, efficient but lower bandwidth actuator is used to satisfy the force request. Only the residual force that can not be satisfied by the bandwidth limitations of the efficient actuator is left for the high-bandwidth, less-efficient VCM motors. The Z-actuator, however, incorporates integral control to ensure that there is never any DC force required of the Z VCM. The Z actuators are required to support large DC loads. Thus it is very important to ensure that the controller has no "DC-path" from the command to the VCM. The use of integral control in the pressure servo provides such a condition.

The presence of the low pass filter ("R EM Bandwidth" block) in the R EM force controller shown in FIG. 21 provides a function similar to the use of integral control in the pressure controller. The output of the low pass filter is analogous to the input at low frequencies. Thus, the force estimate of the radial EM may match the force request at low frequencies. This provides that there will be not net force applied to the tangential VCM motors at DC. The response of the pressure controller to a pressure command is more difficult to accurately predict than the response of a transconductance amplifier to a current command. For these reasons, it may be preferable to measure pressure directly and employ integral control in the pressure controller to eliminate any DC forces from the Z VCM motors.

Figure 25:
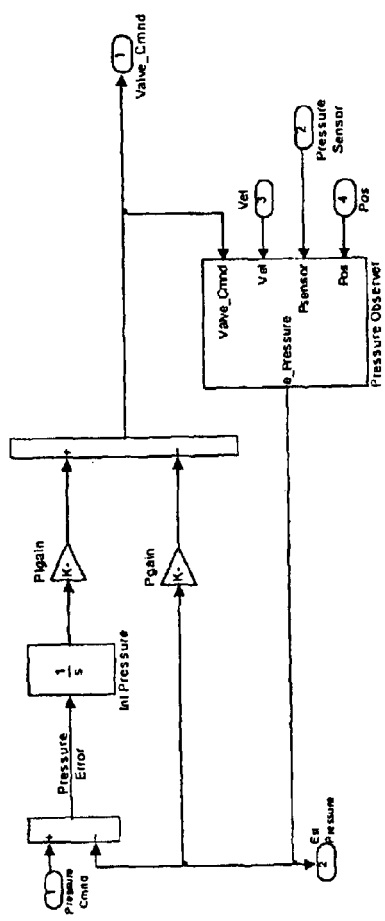
FIG. 25 shows a block diagram of the pressure controller according to the system described herein.

FIG. 25 depicts the arrangement of the pressure controller. The pressure controller may be implemented in a conventional PI (i.e., proportional+integral) configuration with an observer used to provide an "estimate" of the actual cylinder pressure. This is considered conventional practice by those skilled in the art of control systems. Since a pressure sensor is included in the system, one might question the reason behind the use of a pressure observer to estimate pressure. The dynamic performance of the pressure controller is little affected by the use of estimated pressure rather than measured pressure (i.e., using the pressure sensor). However, the raw pressure measurement includes the signal of interest, the cylinder pressure, as well as noise. The noise on the pressure sensor signal is due to ever-present electrical noise as well as quantization effects due to finite precision A/D (i.e., analog to digital) conversion of the analog pressure sensor signal. These noise sources lie outside of the effective bandwidth of the pressure controller. However, since the pressure signal is used in determining the (high bandwidth) VCM force, any noise on the pressure signal will be introduced into the system. At the nanometer level of precision that is required of the manipulator, such noise would compromise performance.

The estimator (also know as an observer), provides a very effective filter to limit the spectrum of noise that would otherwise be introduced into the VCM motors. The estimator is a convenient location where the non-linear behavior of the pressure cylinder dynamics can be handled as well.

Figure 26:
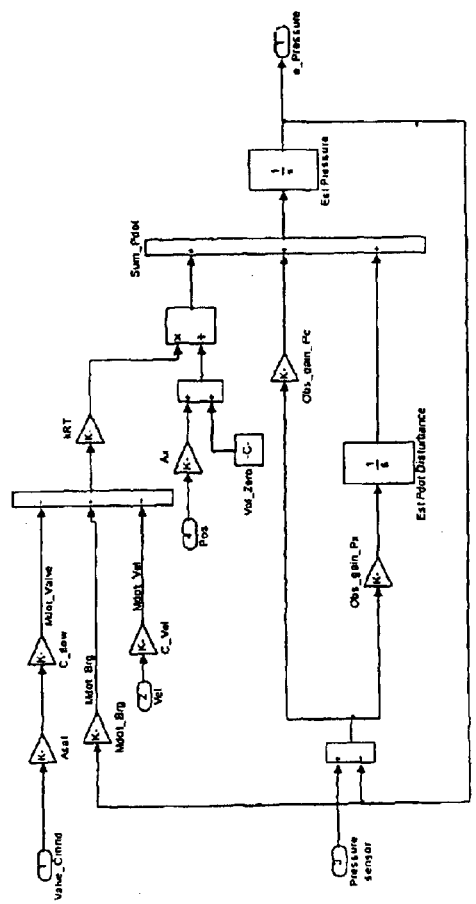
FIG. 26 shows a diagram of a pressure observer circuit according to the system described herein.

FIG. 26 depicts the pressure observer. The form of the observer follows conventional practice for a full-state observer (i.e., a 1 state variable) with a disturbance estimate. The observer makes use of a simplified equation for the gas properties related to the cylinder. The full equations for the gas properties are computationally "expensive" and not needed over the modest range of anticipated pressures. The linear version of the equations is shown in the figure.

There are 3 factors that determine the rate of change of pressure ("Pdot") in the cylinder. Mass flow from the air bearing is continually trying to raise the pressure in the cylinder. Mass flow from the valve is modulated to balance bearing mass flow. Also, if the cylinder is moving, then the pressure in the cylinder would nominally increase or decrease depending upon whether the volume were decreasing or increasing. This effect is captured in the observer with a term that multiplies the actuator velocity ("vel"). The relation between mass flow and pressure change is a function of the mass properties ("kRT") and the cylinder volume. The cylinder volume is a function of the position of actuator and the amount of "dead space" in the cylinder.

The "open loop" computed rate of pressure change is integrated ("est Pressure") to provide an estimate of pressure. This in turn is compared with the measured pressure to form an error term. The error in pressure acts through the observer gain ("Obs_gain_Pc") to ensure that over the frequency range of interest, the estimate of pressure is an accurate representation of the actual pressure.

Note however, that if the open loop estimate of Pdot contained a slight error, a non-zero constant error in estimated pressure would be required in order to provide a "0" at the input to the "Est Pressure" integrator. This would constitute an error in the force estimate for the force controller and lead to a reduction in system performance.

Slight variations in the pressure supplied to the air bearing (due, for instance to the normal level of compliance in typical mechanical pressure regulators) may lead to slight variations in the actual mass flow entering the cylinder. Other variations are anticipated due to changes in the piston to cylinder gap with temperature and age as well as aging in the valve.

These effects can be eliminated from the pressure estimator by the well known use of a disturbance estimator in addition to the pressure estimate. The block labeled "Est Pdot Disturbance" in the figure above provides the necessary correction. Note that the input to the disturbance integrator comes directly from the pressure error. The persistence of any error between measured pressure and estimated pressure will drive the disturbance estimator so as to remove the error. Through the introduction of the disturbance estimator, the estimated pressure will have no DC or low frequency deviation from the measured pressure. This method ensures a high degree of accuracy in the force estimated from the pressure cylinder, which improves the overall performance of the Z actuator.

The benefit of using the observer to estimate the cylinder pressure and thereby reduce noise propagation into the high-bandwidth VCM, is realized by setting the poles of the pressure observer at a relatively low frequency (100 Hz, for instance). The observer functions "open loop" at higher frequencies based on the known command sent to the valve and the measured position and velocity of the cylinder. The disturbance estimator corrects the expected errors in the "open loop" model at low frequencies. The result is a "clean" estimate of the actual cylinder pressure covering a wide dynamic range.

While the invention has been disclosed in connection with various embodiments, modifications thereon will be readily apparent to those skilled in the art. Accordingly, the spirit and scope of the invention is set forth in the following claims.

What is claimed is:

1. An actuator comprising:
   a piston movably guided by an externally pressurized fluid-bearing;
   a fluid chamber formed at one end of the piston having a chamber pressure controlled by balancing a fluid flowing into the fluid chamber with fluid exiting the chamber through a controllable orifice; and
   a voice coil motor disposed to move the piston located within the confines of the piston.

2. The apparatus of claim 1, further comprising:
   a control system that supplies large low-frequency forces by modulating the chamber pressure, and supplies low amplitude high-frequency forces via the voice coil motor.

3. The apparatus of claim 1, wherein the piston further comprises an air-bearing pad disposed above the surface of the piston and allowed to pivot with respect to a vertical axis of the piston.

4. The apparatus of claim 3, wherein the pivot is a ball pivot.

5. The apparatus of claim 1, wherein the fluid may be air.

6. The apparatus of claim 1, further comprising:
   a single valve connected to the pressure chamber and normally operated in a partially open state to regulate the flow of fluid from the pressure chamber to an external source of pressure that is maintained at a pressure substantially below the nominal chamber pressure.

7. The apparatus of claim 1, wherein the chamber pressure and the voice coil motor are independently controllable.

8. An actuator comprising:
   a piston movably guided by a fluid-bearing;
   a fluid chamber formed at one end of the piston having a chamber pressure controlled by balancing a fluid flowing into the fluid chamber with fluid exiting the chamber through a controllable orifice;
   a voice coil motor disposed to move the piston located within the confines of the piston; and
   a control system that supplies large low-frequency forces by modulating the chamber pressure, and supplies low amplitude high-frequency forces via the voice coil motor.

9. The apparatus of claim 8, wherein the piston further comprises an air-bearing pad disposed above the surface of the piston and allowed to pivot with respect to a vertical axis of the piston.

10. The apparatus of claim 9, wherein the pivot is a ball pivot.

11. The apparatus of claim 8, wherein the fluid may be air.

12. The apparatus of claim 8, further comprising:
    a single valve connected to the pressure chamber and normally operated in a partially open state to regulate the flow of fluid from the pressure chamber to an external source of pressure that is maintained at a pressure substantially below the nominal chamber pressure.

13. The apparatus of claim 12, wherein the valve may be open or closed in proportion to a signal from the control system in order to regulate the net mass flow of fluid between the fluid entering the chamber and the mass flow of fluid leaving the chamber through the valve.

14. The apparatus of claim 8, wherein the chamber pressure and the voice coil motor are independently controllable.

15. An actuator, comprising:
  a piston movably guided by a fluid-bearing;
  an external source of fluid that supplies the fluid-bearing;
  a fluid chamber formed at one end of the piston having a chamber pressure controlled by balancing the fluid flowing into the fluid chamber from the fluid-bearing with fluid exiting the chamber through a controllable orifice; and
  a voice coil motor disposed to move the piston located within the confines of the piston.

16. The apparatus of claim 15, further comprising:
  a control system that supplies large low-frequency forces by modulating the chamber pressure, and supplies low amplitude high-frequency forces via the voice coil motor.

17. The apparatus of claim 15, wherein the fluid may be air.

18. The apparatus of claim 15, wherein the chamber pressure and the voice coil motor are independently controllable.

19. An actuator, comprising:
  a piston movably guided by a fluid-bearing;
  an external source of fluid that supplies the fluid-bearing;
  a fluid chamber formed at one end of the piston having a chamber pressure controlled by balancing the fluid flowing into the fluid chamber with fluid exiting the chamber through a controllable orifice;
  a voice coil motor disposed to move the piston located within the confines of the piston; and
  an air-bearing pad disposed above the surface of the piston and allowed to pivot with respect to a vertical axis of the piston.

20. The apparatus of claim 19, wherein the pivot is a ball pivot.

21. An actuator, comprising:
  a piston movably guided by a fluid-bearing;
  an external source of fluid that supplies the fluid-bearing;
  a fluid chamber formed at one end of the piston having a chamber pressure controlled by balancing the fluid flowing into the fluid chamber with fluid exiting the chamber through a controllable orifice;
  a voice coil motor disposed to move the piston located within the confines of the piston; and
  a single valve connected to the pressure chamber and normally operated in a partially open state to regulate the flow of fluid from the pressure chamber to an external source of pressure that is maintained at a pressure substantially below the nominal chamber pressure.

22. The apparatus of claim 21, wherein the valve may be open or closed in proportion to a signal from the control system in order to regulate the net mass flow of fluid between the fluid entering the chamber and the mass flow of fluid leaving the chamber through the valve.

* * * * *